(12) United States Patent
Ralston et al.

(10) Patent No.: US 7,679,649 B2
(45) Date of Patent: Mar. 16, 2010

(54) METHODS FOR DEPLOYING VIDEO MONITORING APPLICATIONS AND SERVICES ACROSS HETEROGENOUS NETWORKS

(76) Inventors: John D. Ralston, 369 La Cuesta Dr., Portola Valley, CA (US) 94028; Krasimir D. Kolarov, 2050 Avy Ave., Menlo Park, CA (US) 94025; Steven E. Saunders, 6069 Shadygrove Dr., Cupertino, CA (US) 95014

( * ) Notice: Subject to any disclaimer, the term of this patent is extended or adjusted under 35 U.S.C. 154(b) by 860 days.

(21) Appl. No.: 11/250,797

(22) Filed: Oct. 13, 2005

(65) Prior Publication Data

US 2006/0085534 A1    Apr. 20, 2006

Related U.S. Application Data

(63) Continuation-in-part of application No. 11/232,726, filed on Sep. 21, 2005, now Pat. No. 7,436,329, application No. 11/250,797, which is a continuation-in-part of application No. 11/232,725, filed on Sep. 21, 2005, application No. 11/250,797, which is a continuation-in-part of application No. 11/232,165, filed on Sep. 20, 2005, now Pat. No. 7,525,463, application No. 11/250,797, which is a continuation-in-part of application No. 10/955,240, filed on Sep. 29, 2004, now abandoned, application No. 11/250,797, which is a continuation-in-part of application No. 10/944,437, filed on Sep. 16, 2004, which is a continuation of application No. 10/418,831, filed on Apr. 17, 2003, now Pat. No. 6,825,780, application No. 11/250,797, which is a continuation-in-part of application No. 10/447,455, filed on May 28, 2003, application No. 11/250,797, which is a continuation-in-part of application No. 10/447,514, filed on May 28, 2003, application No. 11/250,797, which is a continuation-in-part of application No. 10/418,649, filed on Apr. 17, 2003, application No. 11/250,797, which is a continuation-in-part of application No. 10/418,363, filed on Apr. 17, 2003.

(60) Provisional application No. 60/618,938, filed on Oct. 13, 2004, provisional application No. 60/654,058, filed on Feb. 16, 2005, provisional application No. 60/612,652, filed on Sep. 22, 2004, provisional application No. 60/612,651, filed on Sep. 22, 2004, provisional application No. 60/612,311, filed on Sep. 21, 2004, provisional application No. 60/507,148, filed on Sep. 30, 2003, provisional application No. 60/507,147, filed on Sep. 30, 2003, provisional application No. 60/612,311, filed on Sep. 21, 2004, provisional application No. 60/374,061, filed on Apr. 19, 2002, provisional application No. 60/390,380, filed on Jun. 21, 2002, provisional application No. 60/385,253, filed on May 28, 2002, provisional application No. 60/385,250, filed on May 28, 2002, provisional application No. 60/390,345, filed on Jun. 21, 2002, provisional application No. 60/390,492, filed on Jun. 21, 2002, provisional application No. 60/374,069, filed on Apr. 19, 2002, provisional application No. 60/390,383, filed on Jun. 21, 2002, provisional application No. 60/385,254, filed on May 28, 2002, provisional application No. 60/373,974, filed on Apr. 19, 2002, provisional application No. 60/373,966, filed on Apr. 19, 2002.

(51) Int. Cl.
*H04N 5/232* (2006.01)
*H04N 7/173* (2006.01)

(52) U.S. Cl. .................. 348/211.3; 348/207.1; 725/105

(58) Field of Classification Search .............. 348/207.1, 348/211.99, 211.2, 211.3, 445; 725/105; 455/410, 411, 422, 444, 446; 342/457
See application file for complete search history.

(56) References Cited

U.S. PATENT DOCUMENTS

| | | | | | |
|---|---|---|---|---|---|
| 6,029,196 | A | * | 2/2000 | Lenz | 709/221 |
| 6,121,998 | A | * | 9/2000 | Voois et al. | 348/14.13 |
| 6,124,882 | A | * | 9/2000 | Voois et al. | 348/14.08 |
| 6,167,567 | A | * | 12/2000 | Chiles et al. | 717/173 |

| | | | |
|---|---|---|---|
| 6,356,543 B2 | 3/2002 | Hall et al. | |
| 6,754,894 B1 | 6/2004 | Costello et al. | |
| 6,847,403 B1* | 1/2005 | Forsberg et al. | 348/373 |
| 6,876,379 B1* | 4/2005 | Fisher | 348/14.02 |
| 7,266,611 B2 | 9/2007 | Jabri et al. | |
| 2001/0030667 A1 | 10/2001 | Kelts | |
| 2002/0012347 A1 | 1/2002 | Fitzpatrick | |
| 2002/0022522 A1 | 2/2002 | Yamada | |
| 2002/0147974 A1* | 10/2002 | Wookey | 717/176 |
| 2002/0184643 A1 | 12/2002 | Fichet | |
| 2003/0084283 A1* | 5/2003 | Pixton | 713/163 |
| 2004/0133914 A1 | 7/2004 | Smith et al. | |
| 2004/0166834 A1* | 8/2004 | Omar et al. | 455/414.1 |
| 2005/0036034 A1* | 2/2005 | Rea et al. | 348/207.1 |
| 2006/0072837 A1* | 4/2006 | Ralston et al. | 382/232 |
| 2006/0218482 A1 | 9/2006 | Ralston et al. | |
| 2008/0072261 A1* | 3/2008 | Ralston et al. | 725/62 |

FOREIGN PATENT DOCUMENTS

| | | | |
|---|---|---|---|
| JP | 2000276335 A | * | 10/2000 |
| JP | 2001-285420 | | 10/2001 |
| JP | 2002149536 A | * | 5/2002 |
| JP | 2003122591 A | * | 4/2003 |
| JP | 2003209510 A | * | 7/2003 |
| KR | 2005112676 A | * | 12/2005 |
| KR | 2007058041 A | * | 6/2007 |
| WO | WO 01/77906 | | 10/2001 |
| WO | WO 2004/0044710 | | 5/2004 |
| WO | WO 2004/059994 | | 7/2004 |

OTHER PUBLICATIONS

International Search Report and Written Opinion for PCT/US05/37235, mailed Feb. 19, 2008, 10 pages.
International Preliminary Report on Patentability for PCT/US05/37235, completed Feb. 4, 2008, 7 pages.
International Search Report and Written Opinion for PCT/US2006/005891, mailed Oct. 2, 2007, 9 pages.
International Preliminary Report on Patentability for PCT/US2006/005891, completed Oct. 30, 2007, 1 page.
Supplementary European Search Report for EP 06735520, mailed Dec. 5, 2008, 7 pages.

* cited by examiner

*Primary Examiner*—John M Villeccco
(74) *Attorney, Agent, or Firm*—Wayne A. Jones

(57) ABSTRACT

Methods for the deployment of an image servicing platform over a mobile wireless network are described. A mobile multimedia service controller (MMSC) includes a video gateway that is capable of transcoding among different video formats supported by an imaging service platform. The MMSC can be connected over a network to a download server that provides updates to a transcoder application and a video image application.

10 Claims, 21 Drawing Sheets

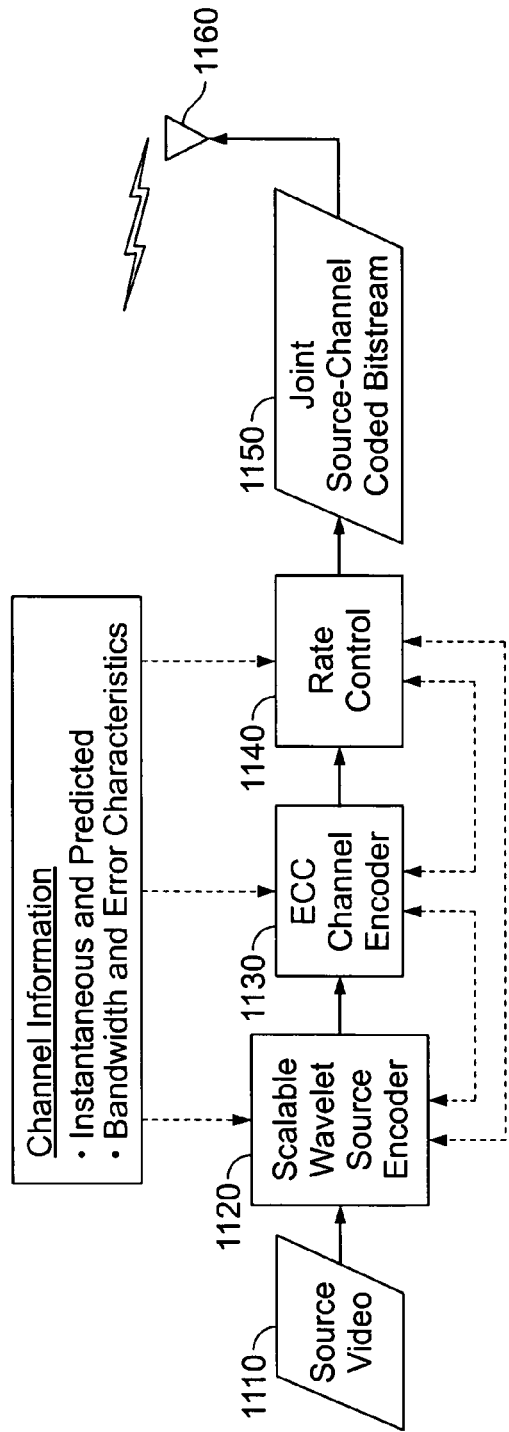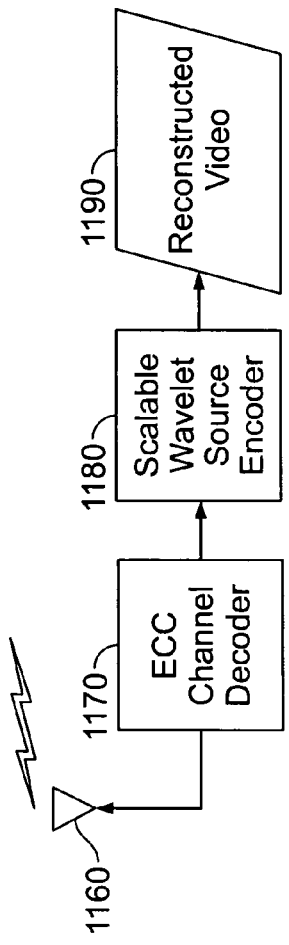

METHODS FOR DEPLOYING VIDEO MONITORING APPLICATIONS AND SERVICES ACROSS HETEROGENOUS NETWORKS

RELATED APPLICATIONS

The present application claims priority from U.S. Patent Application No. 60/618,938 filed Oct. 13, 2004 entitled "Video Monitoring Application, Device Architectures, and System Architecture"; and also claims priority from U.S. Patent Application No. 60/654,058 filed Feb. 16, 2005 entitled "Mobile Imaging Application, Device Architecture, and Service Platform Architecture And Services"; each of which is incorporated herein by reference in its entirety.

The present application is a continuation-in-part of U.S. patent application Ser. No. 11/232,726 filed Sep. 21, 2005 now U.S. Pat. No. 7,436,329 entitled "Multiple Technique Entropy Coding System and Method" which claims priority from U.S. Provisional Application No. 60/612,652 filed Sep. 22, 2004; continuation-in-part of U.S. patent application Ser. No. 11/232,725 filed Sep. 21, 2005 entitled "Permutation Procrastination" which claims priority from U.S. Provisional Application No. 60/612,651 filed Sep. 22, 2004; continuation-in-part of U.S. application Ser. No. 11/232,165 filed Sep. 20, 2005 now U.S. Pat. No. 7,525,463 entitled "Compression Rate Control System and Method with Variable Subband Processing" which claims priority from U.S. Provisional Application No. 60/612,311 filed Sep. 21, 2004; continuation-in-part of U.S. patent application Ser. No. 10/955,240 filed Sep. 29, 2004 now abandoned entitled "System and Method for Temporal Out-of-Order Compression and Multi-Source Compression Rate Control" now U.S. Publication No. US 2005/0105609 published on May 19, 2005, which claims priority from U.S. Provisional Application No. 60/612,311 filed Sep. 21, 2004, U.S. Provisional Application No. 60/507,148 and U.S. Provisional Application No. 60/507,147 both filed Sep. 30, 2003; continuation-in-part of U.S. patent application Ser. No. 10/944,437 filed Sep. 16, 2004 entitled "Multiple Codec-Imager System and Method" now U.S. Publication No. US 2005/0104752 published on May 19, 2005, which is a continuation of Ser. No. 10/418,831 filed on Apr. 17, 2003 U.S. Pat. No. 6,825,780 issued Nov. 30, 2004 which claims priority from U.S. Provisional Application No. 60/390,380 filed Jun. 21, 2002 and U.S. Provisional Application No. 60/374,061 filed Apr. 19, 2002; continuation-in-part of U.S. patent application Ser. No. 10/447,455 filed on May 28, 2003 entitled "Pile-Processing System and Method for Parallel Processors" now U.S. Publication No. US 2003/0229773 published on Dec. 11, 2003, which claims priority from U.S. Provisional Application Nos. 60/385,253 and 60/385,250 both filed on May 28, 2002; continuation-in-part of U.S. patent application Ser. No. 10/447,514 filed on May 28, 2003 entitled "Chroma Temporal Rate Reduction and High-Quality Pause System and Method" now U.S. Publication No. US 2003/0235340 published on Dec. 25, 2003; which claims priority from U.S. Provisional Application Nos. 60/390,345 and 60/390,492 both filed on Jun. 21, 2002; continuation-in-part of U.S. patent application Ser. No. 10/418,649 filed Apr. 17, 2003 entitled "System, Method and Computer Program Product for Image and Video Transcoding" now U.S. Publication No. US 2003/0206597 published on Nov. 6, 2003, which claims priority from U.S. Provisional Application No. 60/374,069 filed Apr. 19, 2002; continuation-in-part of U.S. patent application Ser. No. 10/418,363 filed Apr. 17, 2003 entitled "Wavelet Transform System, Method and Computer Program Product" now U.S. Publication No. US 2003/0198395 published on Oct. 23, 2003, which claims priority from U.S. Provisional Patent Application No. 60/390,383 filed on Jun. 21, 2002, U.S. Provisional Patent Application No. 60/385,254 filed May 28, 2002 and U.S. Provisional Application Nos. 60/373,974 and 60/373,966 both filed on Apr. 19, 2002; each of which is incorporated herein by reference in its entirety.

This application also incorporates by reference in its entirety U.S. Pat. No. 6,847,317 issued on Jan. 25, 2005 entitled "System and Method for a Dyadic-Monotonic (DM) Codec"; and U.S. Pat. No. 6,825,780 issued on Nov. 30, 2004 entitled "Multiple Codec-Imager System and Method."

FIELD OF THE INVENTION

The present invention relates to data compression, and more particularly to still image and video image recording in video monitoring systems, corresponding device architectures, and system architectures for transmitting, storing, editing, processing, and transcoding still images over wireless and wired networks and viewing them on display-enabled devices as well as distributing and updating codecs across networks and devices.

BACKGROUND OF THE INVENTION

Directly digitized still images and video requires many "bits." Accordingly, it is common to compress images and video for storage, transmission, and other uses. Several basic methods of compression are known, and very many specific variants of these. A general method can be characterized by a three-stage process: transform, quantize, and entropy-code. Many image and video compressors share this basic architecture, with variations.

The intent of the transform stage in a video compressor is to gather the energy or information of the source picture into as compact a form as possible by taking advantage of local similarities and patterns in the picture or sequence. Compressors are designed to work well on "typical" inputs and can ignore their failure to compress "random" or "pathological" inputs. Many image compression and video compression methods, such as MPEG-2 and MPEG-4, use the discrete cosine transform (DCT) as the transform stage. Some newer image compression and video compression methods, such as MPEG-4 static texture compression, use various wavelet transforms as the transform stage.

Quantization typically discards information after the transform stage. The reconstructed decompressed image then is not an exact reproduction of the original.

Entropy coding is generally a lossless step: this step takes the information remaining after quantization and usually codes it so that it can be reproduced exactly in the decoder. Thus the design decisions about what information to discard in the transform and quantization stages is typically not affected by the following entropy-coding stage.

A limitation of DCT-based video compression/decompression (codec) techniques is that, having been developed originally for video broadcast and streaming applications, they rely on the encoding of video content in a studio environment, where high-complexity encoders can be run on computer workstations. Such computationally complex encoders allow computationally simple and relatively inexpensive decoders (players) to be installed in consumer playback devices. However, such asymmetric encode/decode technologies are not ideal for many emerging video monitoring devices and applications in which video messages are captured and encoded in real time in devices with limited computational resources.

SUMMARY OF THE INVENTION

The instant invention presents solutions to the shortcomings of prior art compression techniques and provides a highly sophisticated yet computationally highly efficient image compression (codec) that can be implemented as an all-software (or hybrid) application on mobile handsets, still image and video monitoring cameras, reducing the complexity of the device architecture and the complexity of the imaging service platform architecture. Aspects of the present invention's all-software or hybrid video codec solution substantially reduces or eliminates baseband processor and video accelerator costs and requirements in multimedia handsets and cameras. Combined with the ability to install the codec post-production via OTA download, the present invention in all-software or hybrid solutions substantially reduces the complexity, risk, and cost of both handset or camera device development and video monitoring service architecture and deployment. Further, according to aspects of the present invention, software video transcoders enable automated over-the-network (OTN) upgrade of deployed MMS control (MMSC) infrastructure as well as deployment or upgrade of codecs to mobile handsets and camera devices. The present invention's wavelet transcoders provide carriers with complete interoperability between the wavelet video format and other standards-based and proprietary video formats. The present all-software or hybrid video platform allows rapid deployment of new MMS services that leverage processing speed and video production accuracy not available with prior art technologies. The present wavelet codecs are also unique in their ability to efficiently process both still images and video, and can thus replace separate codec formats with a single lower-cost and lower-power solution that can simultaneously support both still images and video images in monitoring applications, as well as in other services.

BRIEF DESCRIPTION OF THE DRAWINGS

FIG. 11 illustrates an improved system for joint source-channel coding.

DETAILED DESCRIPTION OF THE PREFERRED EMBODIMENTS

Wavelet-Based Image Processing

A wavelet transform comprises the repeated application of wavelet filter pairs to a set of data, either in one dimension or in more than one. For still image compression, a 2-D wavelet transform (horizontal and vertical) can be utilized. Video codecs can use a 3-D wavelet transform (horizontal, vertical, and temporal). An improved, symmetrical 3-D wavelet-based video compression/decompression (codec) device is desirable to reduce the computational complexity and power consumption in video monitoring devices and applications to a level well below those required for DCT-based codecs, as well as to enable simultaneous support for processing still images and video images in a single codec. Such simultaneous support for still images and video images in a single codec would eliminate the need for separate MPEG (video) and JPEG (still image) codecs, or greatly improve compression performance and hence storage efficiency with respect to Motion JPEG codecs.

Video Monitoring System Architecture

Increased security concerns have triggered growing demand for video monitoring systems in retail businesses, banks, schools, enterprises, government offices, airports, transportation departments, military installations, and many other organizations.

Figure 1:
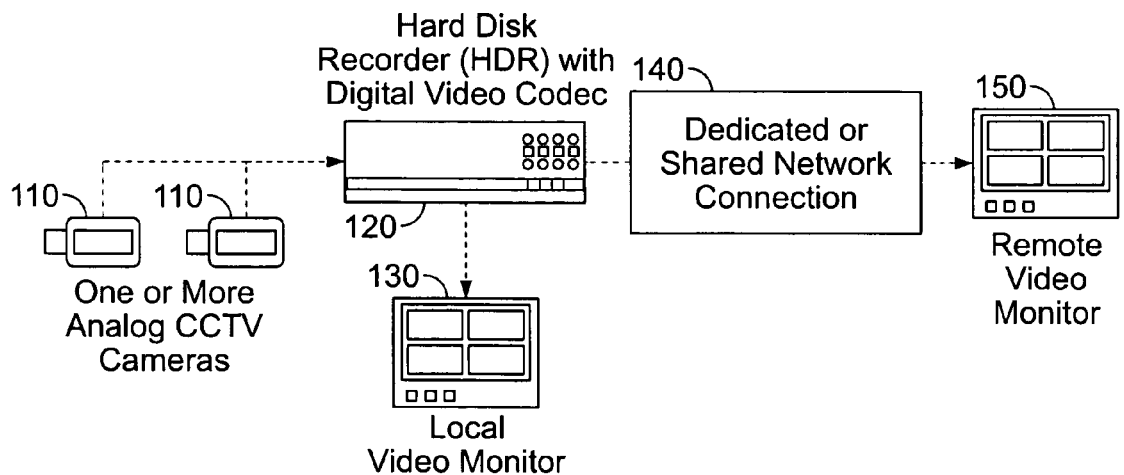
FIG. 1 illustrates an architecture of a video monitoring system using analog CCTV cameras.

Referring to FIG. 1, the architecture of many deployed video monitoring systems typically consists of one or more analog closed-circuit TV (CCTV) cameras 110 remotely connected to one or more hard disk recorder (HDR) units 120. Functions contained in the HDR typically include:

digitization of the analog video signals input from CCTV cameras compression of the digitized video signals to reduce hard disk storage requirements storage of the compressed video signals decompression of the stored compressed video signals for viewing on local video monitor(s) 130 transmission of the compressed video signals over a dedicated or shared network connection 140 for remote decompression and viewing on remote video decompression units and viewing monitors 150.

Images can be viewed either locally from the HDR 120, for example in a central video monitoring facility, or transmitted over a dedicated or shared network connection 140 for remote viewing, allowing any number of authorized viewers to view real-time or recorded video images simultaneously.

Figure 2:
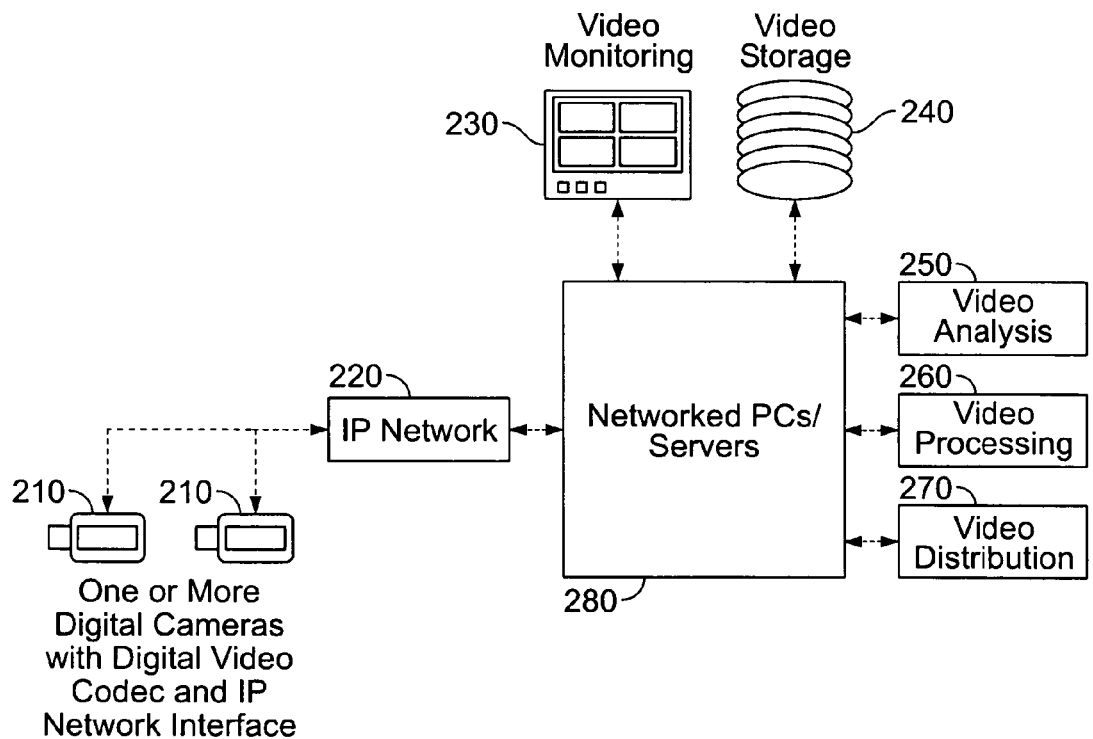
FIG. 2 illustrates an architecture of a video monitoring system using digital video cameras and IP network.

Referring to FIG. 2, in order to take advantage of new, more flexible, lower-cost, and higher-speed digital network transmission, storage, and processing technologies, some newer video monitoring systems utilize digital IP cameras 210. Such cameras 210 enable digitization and compression of video signals directly in the camera 210, and the compressed video can then be transmitted directly from the camera 210 over Internet Protocol (IP) networks 220 to PC or server-based devices for remote storage, viewing, and further analysis. Such devices can include video monitoring devices 230, video storage devices 240, video analysis devices 250, video processing devices 260 and/or video distribution devices 270, each connected to networked PCs and/or servers 280.

Figure 3:
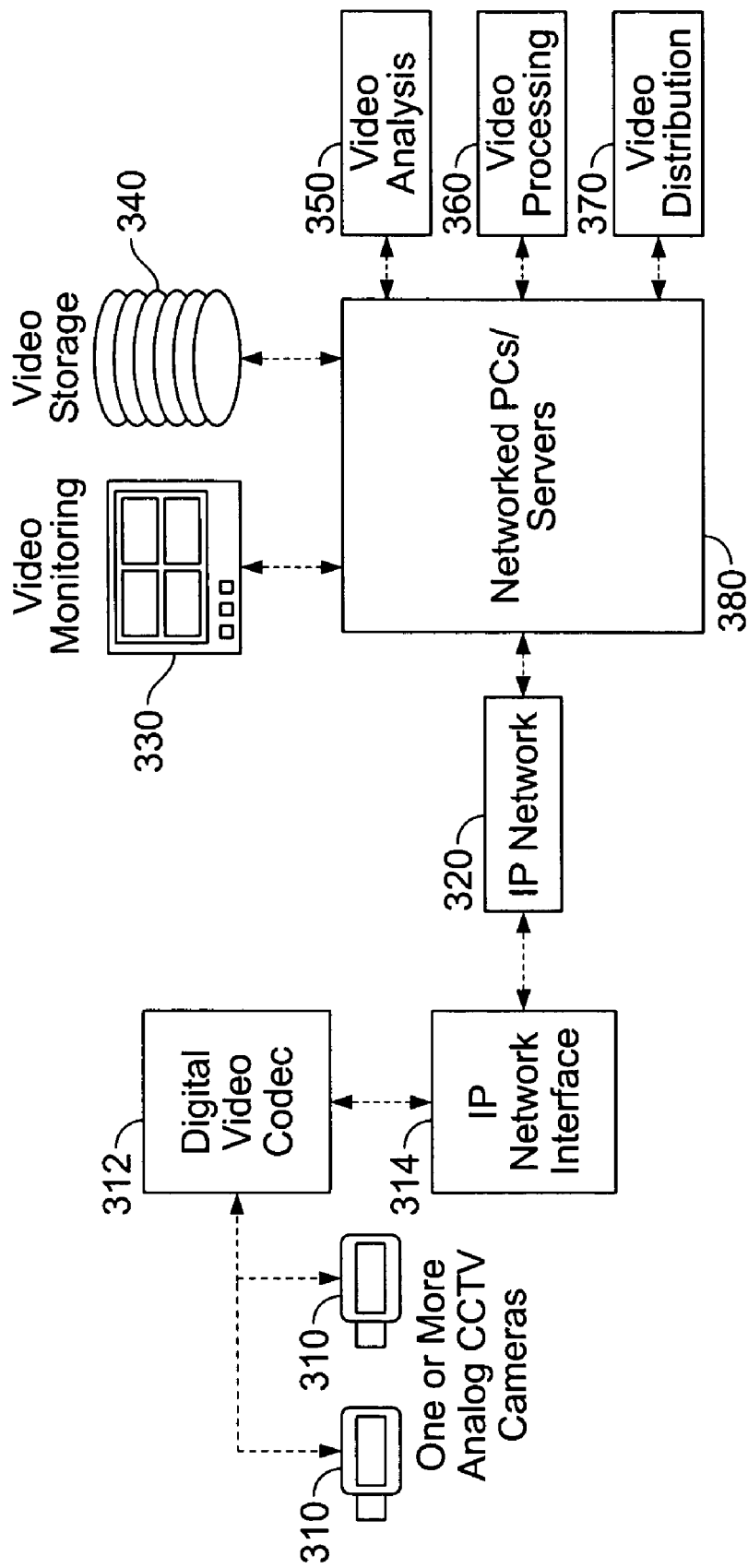
FIG. 3 illustrates an architecture of a video monitoring system using analog cameras with external digital video codecs and IP network interface.

Referring to FIG. 3, in order to support the upgrade of legacy video monitoring systems using analog CCTV cameras 310, it is also possible to provide stand-alone digital codecs 312 and IP network 320 interfaces 314 to the analog CCTV cameras 310 for interconnection with devices such as 330, 340, 350, 360, 370 and 380, analogous to the devices described above in reference to FIG. 2.

Figure 4:
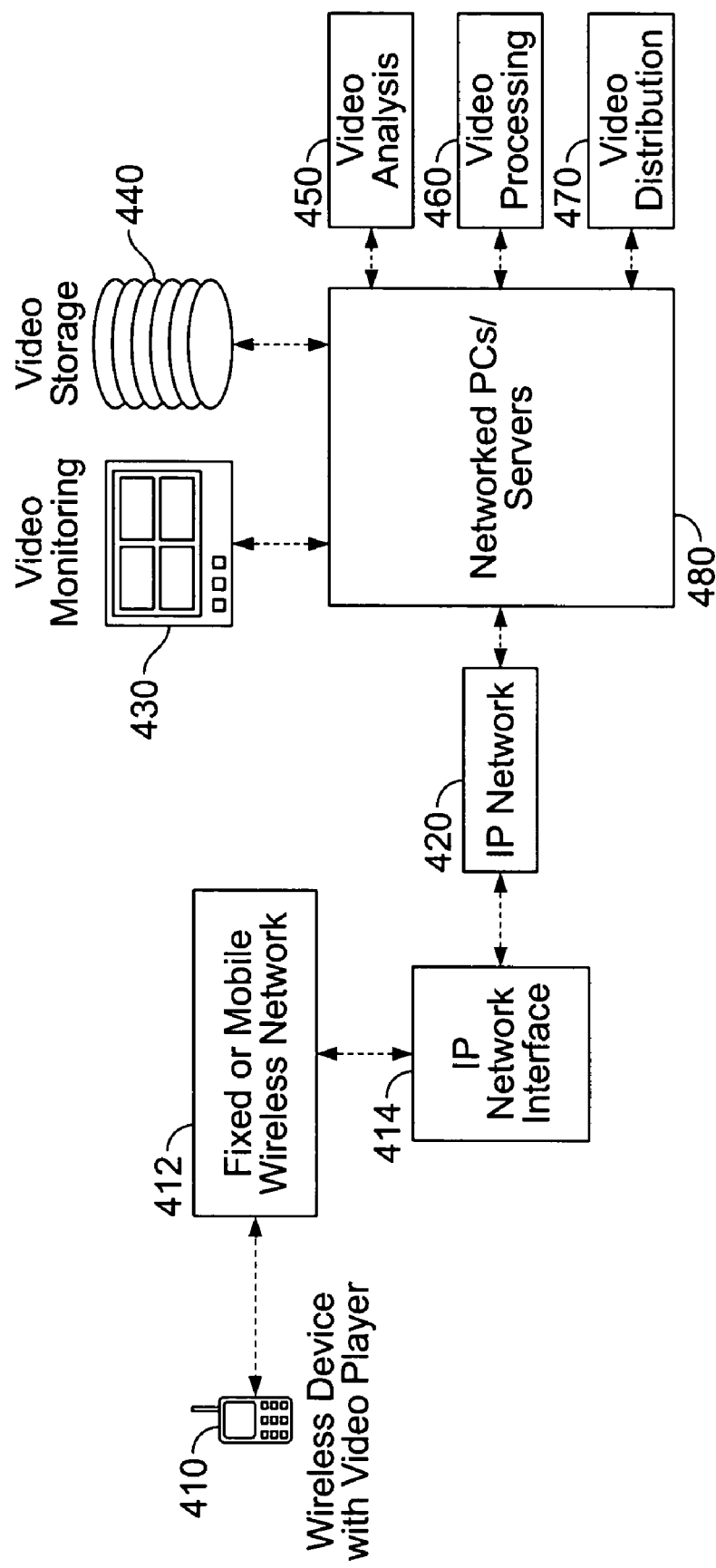
FIG. 4 illustrates an architecture of a digital video monitoring system using a wireless device with integrated video display capability.

Furthermore, referring to FIG. 4, some newer video monitoring systems enable access to and viewing of digital compressed video over the network 412 using fixed or mobile wireless devices 410 equipped with video display capabilities. In addition to video display capabilities, it would be desirable to enable real-time capture of video in wireless devices connected to video monitoring networks having such components as 414, 420, 430, 440, 450, 460, 470 and 480 described above in reference to FIGS. 2 and 3.

Digital Video Monitoring Cameras

Figure 5:
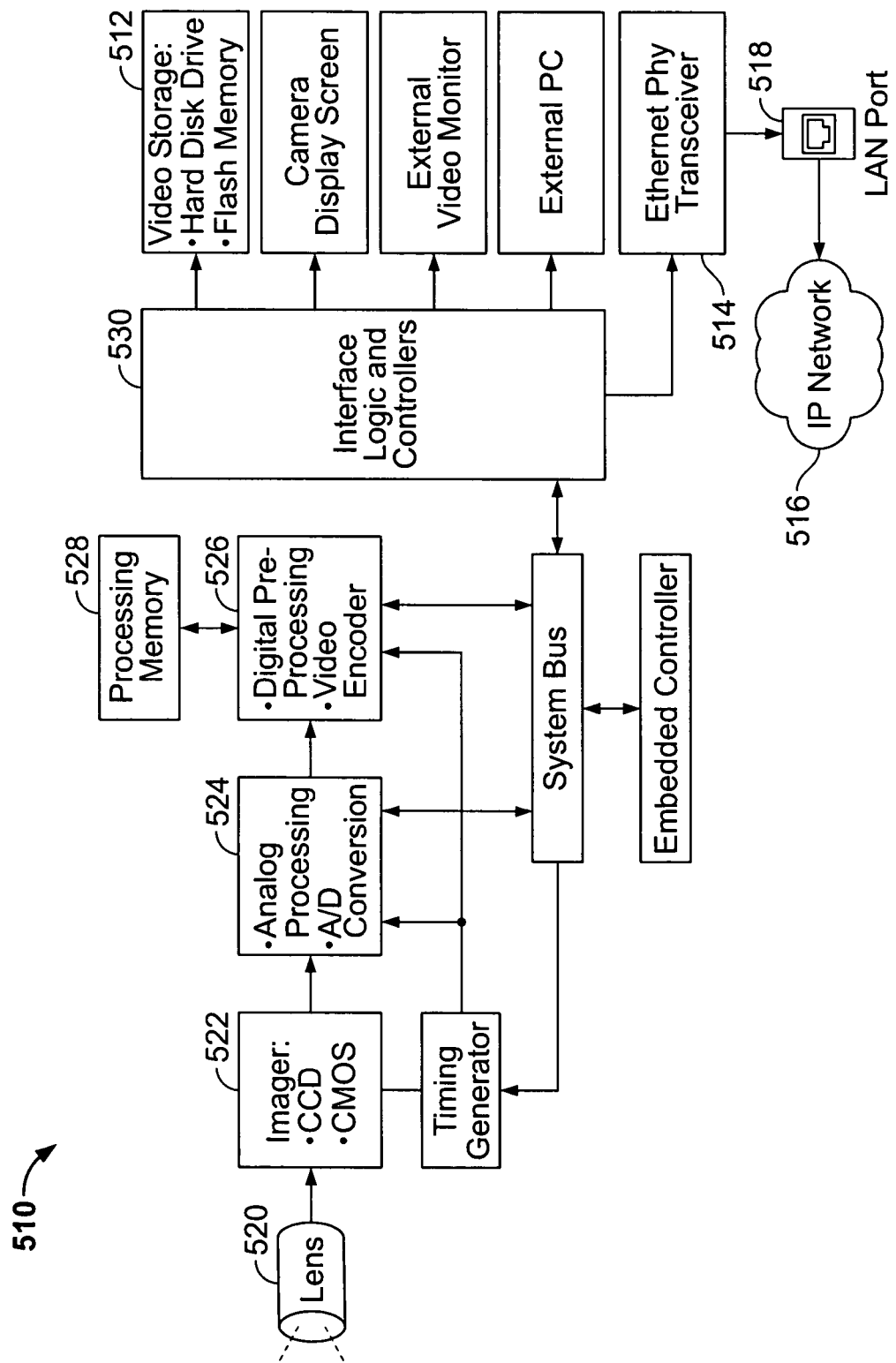
FIG. 5 illustrates an architecture of a digital monitoring camera with integrated IP network interface.

Referring to FIG. 5, a Digital Video Monitoring Camera 510 is a video surveillance system that digitizes and compresses the analog video and audio to minimize transmission bandwidth and storage 512 requirements. Such a camera 510 may also include an integrated IP network interface 514 that permits the camera 510 to stream video across IP-protocol networks 516, such as Local Area Networks (LANs) 518, without the expense of bulky coaxial cables. The core subsystems of such a digital video monitoring camera 510 include:

Lens subsystem 520

Imaging array (CCD or CMOS) and read-out electronics 522

Analog Processing and A/D Conversion 524: performs pre-amplification, signal conditioning, and analog-to-digital (A/D) signal conversion circuitry connected to or integrated with analog imager array for input to the digital processing.

Digital Processing 526: performs motion compensation and other similar real-time image capture processing, color space conversion, compression/decompression, and post processing such as image scaling and transrating.

Processing Memory 528: stores executing code and data/parameters.

Interfacing Logic and Controllers 530: provides interfacing to integrated storage and display, as to local external display monitors and other display/processing devices such as PCs Network Interface 514: provides data packetization for data communication over the IP network 516, and transmits and receives voice/video data packets through the IP network 516.

Other core subsystems not shown in FIG. 5 include:

Audio Interface: interfaces with microphone/speaker and uses audio codec to digitize the audio signal.

Power Conversion: converts input power from an AC adaptor or battery supply to run various functional blocks.

The above subsystems may be implemented either in hardware or software, or as a combination of hardware and software. Voice/video data may be stored using built-in or removable memory, and/or transmitted via non-real-time file transfer or real-time streaming over the IP network.

Figure 6:
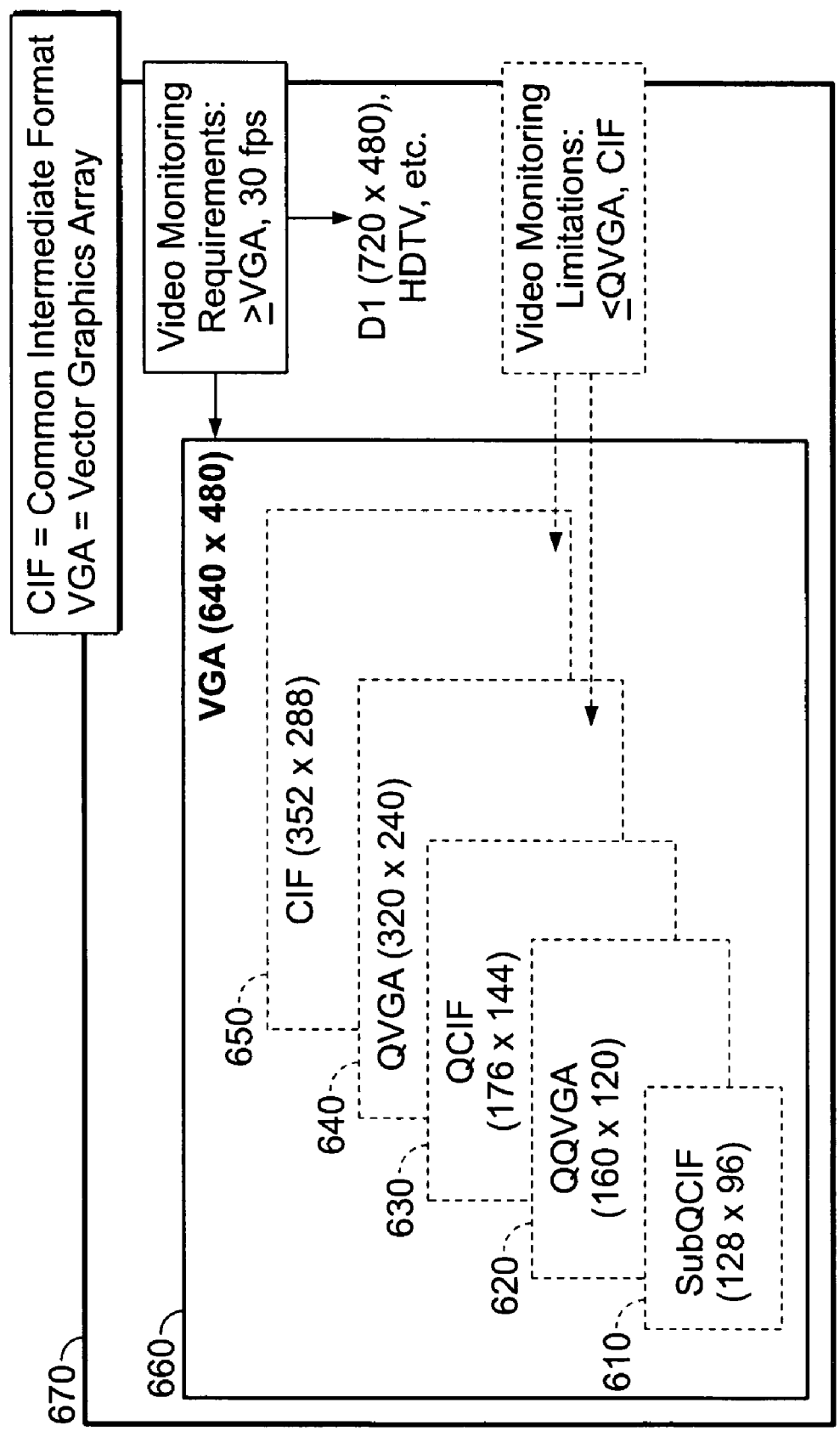
FIG. 6 illustrates physical display size and resolution differences between common video display formats.

Referring to FIG. 6, using codecs based on DCT transforms, such as MPEG-4, commercially available digital video monitoring cameras are limited to capturing smaller-size and lower-frame-rate video images than those typically captured and displayed using analog CCTV cameras and other multimedia devices, such as TVs, personal computers, and digital video camcorders. As shown in FIG. 6, the smallest current format, SubQCIF 610 (SubQ-common intermediate format) is 128 pixels (picture elements) wide by 96 pixels high, QQVGA 620 (QQ-Vector graphics array) is 160 by 120 pixels, QCIF 630 is 176 by 144 pixels, QVGA 640 is 320 by 240 pixels, CIF 650 is 352 by 288 pixels, VGA 660 is 640 by 480 pixels, and the largest current format, D1/HDTV 670 (high-definition television), is 720 by 480 pixels. Video monitoring applications typically require capture/display video images in VGA 660 (640×480 pixels) or D1 670 (720×480) format or larger, at a display rate of 30 frames-per-second (fps) or higher, whereas commercially available digital video monitoring cameras are typically limited to capturing video images in CIF 650 (352×288) format or QCIF 630 format (176×144 pixels) or smaller, at a display rate of 15 fps or lower. This reduced video capture capability is due to the excessive processor power consumption and buffer memory required to complete the number, type, and sequence of computational steps associated with video compression/decompression using DCT transforms.

Using commercially available video codec and microprocessor technologies leads to very complex, power-hungry, and expensive architectures for digital video monitoring cameras that target capture of VGA 660 (or larger) video at a frame rate of 30 fps or higher. Such camera architectures would include codecs that utilize a combination of both software programs and hardware accelerators running on a combination of reduced instructions set (RISC) processors, digital signal processors (DSPs), application-specific integrated circuits (ASICs), and reconfigurable processing devices (RPDs), together with larger buffer memory blocks (typical memory capacity of 1 Mbyte or more). These codec functions may be implemented using such RISC processors, DSPs, ASICs, and RPDs as separate integrated circuits (ICs), or may combine one or more of the RISC processors, DSPs, ASICs, and RPDs integrated together in a system-in-a-package (SIP) or system-on-a-chip (SoC).

Digital video monitoring camera manufacturers currently offer low-resolution, low-quality video encoding in the camera (i.e. QCIF 630 or CIF 650@15 fps) using Motion-JPEG, MPEG-1, or MPEG-4 codecs. These codecs are available as chipsets from a number of manufacturers, with power consumption ranging from 10-60 mW for the above limited image formats and frame rates. For video monitoring systems, an improved video codec and imaging application according to aspects of the present invention with the following specifications is far more desirable:

Support for both still images and video

Digital image quality that is acceptable for video monitoring and IP network distribution: full VGA 660 (640×480) or D1 670 (720×480) at 30 fps Total power consumption under 100 mW (for VGA, 30 fps), with 50 mW reserved for the sensor All-software implementation capable of running on industry-standard multimedia processors.

An all-software implementation of such an improved video codec and imaging application according to aspects of the present invention is also desirable for the capability to be downloaded to, installed in, "bug-fixed", and upgraded in already-deployed digital monitoring cameras.

Such an improved video codec and imaging application would also be desirable as an external device, in order to support the upgrade of legacy video monitoring systems using analog CCTV cameras 110 or 310.

Furthermore, it would be desirable to provide such an improved video codec and imaging application in fixed or mobile wireless devices 410, to enable the capture of high-quality video monitoring signals, transmission of these signals to PC or server-based devices in the video monitoring network over fixed or mobile wireless connections, and receive video signals from other video monitoring devices for remote viewing on the wireless device 410. Such wireless devices could be special purpose video monitoring devices, or commercial video-enabled mobile handsets (i.e. camcorder phones).

Video Monitoring Using Video-Enabled Wireless Devices

Figure 7:
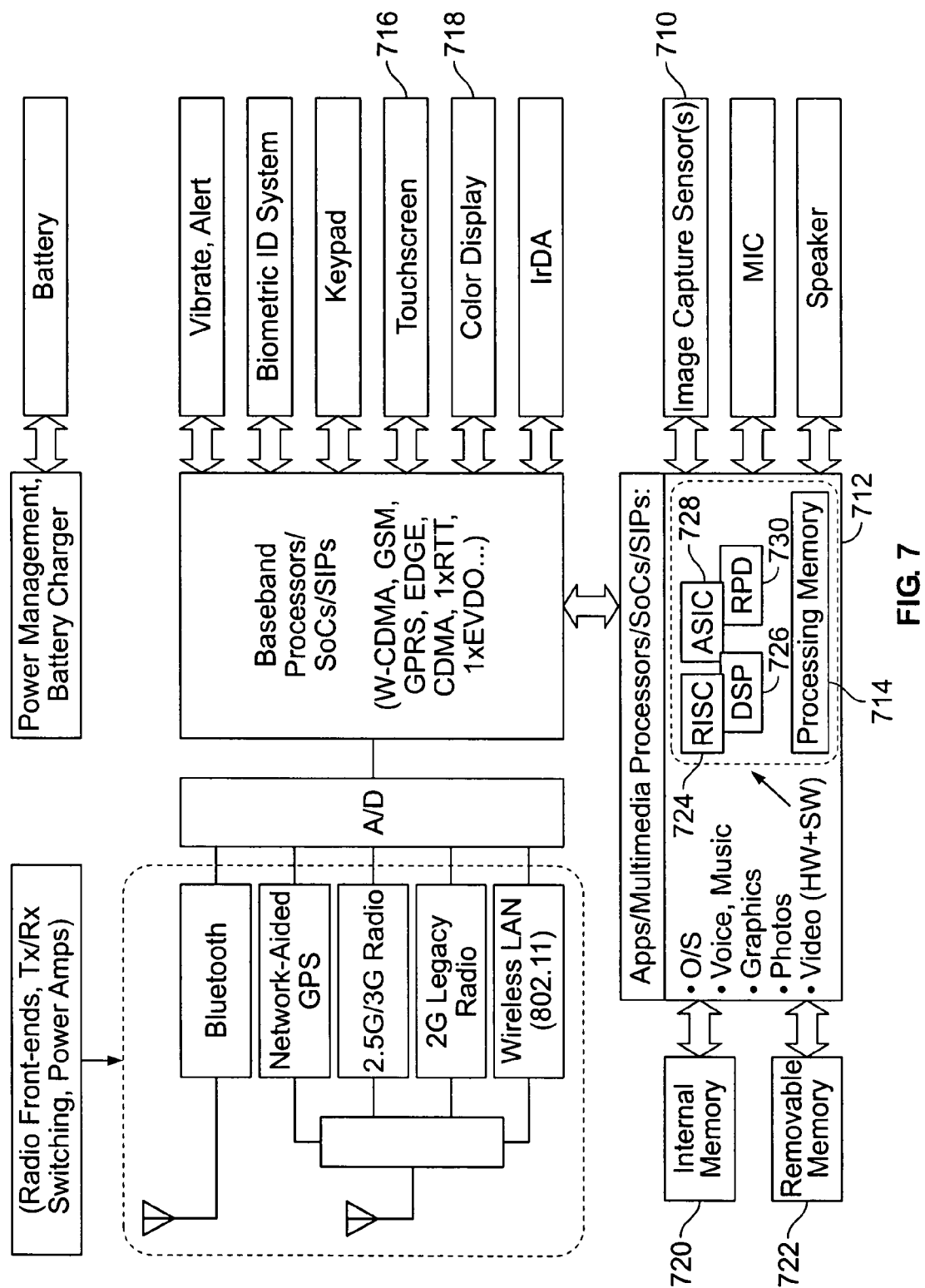
FIG. 7 illustrates a mobile imaging handset architecture.

Referring to FIG. 7, wireless video monitoring includes the addition of digital camera functionality (still images) or camcorder functionality (video images) to mobile handsets, so that users can both capture (encode) video messages that they wish to send, and play back (decode) video messages that they receive. The addition of digital camcorder functionality to mobile handsets may involve adding the following functions, either in hardware, software, or as a combination of hardware and software:

imager array 710 (typically array of CMOS or CCD pixels), with corresponding pre-amps and analog-to-digital (A/D) signal conversion circuitry image processing functions 712 such as pre-processing, encoding/decoding (codec), post-processing buffering 714 of processed images for non-real-time transmission or real-time streaming over wireless or wireline networks one or more image display screens, such as a touchscreen 716 or color display 718 local image storage on built-in memory 720 or removable memory 722.

Using codecs based on DCT transforms, such as MPEG-4, commercially available imaging-enabled mobile handsets are limited to capturing smaller-size and lower-frame-rate video images than those typically required for video monitoring application. Video monitoring applications typically require capture/display of video images in VGA 660 (640×480 pixels) or D1 670 (720×480) format or larger, at a display rate of 30 frames-per-second (fps) or higher, whereas commercially available imaging-enabled mobile handsets are limited to capturing video images in QCIF 630 format (176×144 pixels) or smaller, at a display rate of 15 fps or lower. This reduced video capture capability is due to the excessive processor power consumption and buffer memory required to complete the number, type, and sequence of computational steps associated with video compression/decompression using DCT transforms. Even with this reduced video capture capability of commercially available mobile handsets, specially designed integrated circuit chips have been needed to be built into the handset hardware to accomplish the compression and decompression.

Using commercially available video codec and microprocessor technologies would lead to very complex, power-hungry, and expensive architectures with long design and manufacturing lead times for mobile imaging handsets that would attempt to capture VGA 660 (or larger) video at a frame rate of 30 fps or higher. Such handset architectures would require codecs that utilize a combination of both software programs and hardware accelerators running on a combination of reduced instructions set (RISC) processors 724, digital signal processors (DSPs) 726, application-specific integrated circuits (ASICs) 728, and reconfigurable processing devices (RPDs) 730, together with larger buffer memory blocks 714 (typical memory capacity of 1 Mbyte or more). These codec functions might be implemented using such RISC processors 724, DSPs 726, ASICs 728, and RPDs 730 as separate integrated circuits (ICs), or might combine one or more of the RISC processors 724, DSPs 726, ASICs 728, and RPDs 730 integrated together in a system-in-a-package (SIP) or system-on-a-chip (SoC).

Codec functions running on RISC processors 724 or DSPs 726 in conjunction with the above hardware can be software routines, with the advantage that they can be modified in order to correct errors or upgrade functionality. The disadvantage of implementing certain complex, repetitive codec functions as software is that the resulting overall processor resource and power consumption requirements typically exceed those available in mobile communications devices. Codec functions running on ASICs 728 are typically fixed hardware implementations of complex, repetitive computational steps, with the advantage that specially tailored hardware acceleration can substantially reduce the overall power consumption of the codec. The disadvantages of implementing certain codec functions in fixed hardware include longer and more expensive design cycles, the risk of expensive product recalls in the case where errors are found in the fixed silicon implementation, and the inability to upgrade fixed silicon functions in the case where newly developed features are to be added to the imaging application. Codec functions running on RPDs 730 are typically routines that require both hardware acceleration and the ability to add or modify functionality in final mobile imaging handset products. The disadvantage of implementing certain codec functions on RPDs 730 is the larger number of silicon gates and higher power consumption required to support hardware reconfigurability in comparison to fixed ASIC 728 implementations.

An imaging application constructed according to some aspects of the present invention reduces or eliminates complex, repetitive codec functions so as to enable wireless video monitoring handsets to capture VGA 660 (or larger) video at a frame rate of 30 fps with an all-software architecture. This arrangement simplifies the above architecture and enables handset costs compatible with high-volume commercial deployment.

New multimedia handsets may also be required not only to support picture and video messaging capabilities, but also a variety of additional multimedia capabilities (voice, music, graphics) and wireless access modes (2.5G and 3G cellular access, wireless LAN, Bluetooth, GPS . . . ). The complexity and risk involved in developing, deploying, and supporting such products makes over-the-air (OTA) distribution and management of many functions and applications far more desirable, in order to more efficiently deploy new revenue-generating services and applications, and to avoid costly product recalls. The all-software imaging application provided by aspects of the present invention enables OTA distribution and management of the imaging application in wireless video monitoring devices connected to commercial or private wireless networks.

Mobile Video Monitoring System Architecture

Figure 8:
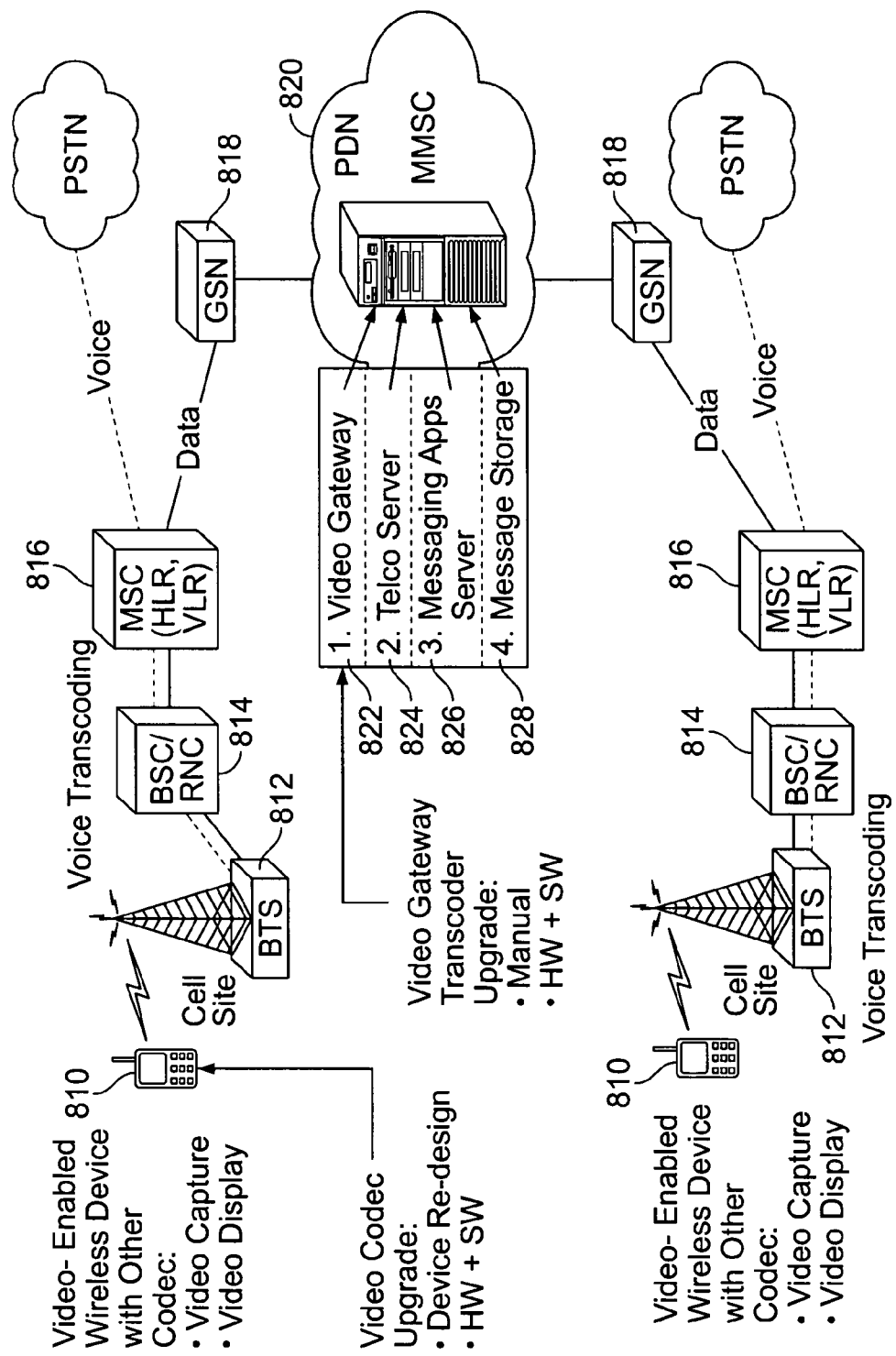
FIG. 8 illustrates a mobile imaging service platform architecture.

Referring to FIG. 8, key components of a typical mobile wireless network capable of supporting imaging services such as video monitoring may include:

Mobile Handsets 810
Mobile Basestations (BTS) 812
Basestation Controller/Radio Network Controller (BSC/RNC) 814
Mobile Switching Center (MSC) 816
Gateway Service Node (GSN) 818
Mobile Multimedia Service Controller (MMSC) 820

Typical functions included in the MMSC (see FIG. 8) include:

Video gateway 822
Teleco server 824
MMS applications server 826
Storage server 828

The video gateway 822 in an MMSC 820 serves to transcode between the different video formats that are supported by the imaging service platform. Transcoding is also utilized by wireless operators to support different voice codecs used in mobile telephone networks, and the corresponding voice transcoders are integrated into the RNC 814. Upgrading such a mobile imaging service platform with the architecture shown in FIG. 8 includes deploying new handsets 810, and manually adding new hardware to the MMSC 820 video gateway 822.

An all-software mobile imaging applications service platform constructed according to aspects of the present invention supports automated OTA upgrade of deployed handsets 810, and automated OTN upgrade of deployed MMSCs 820, in order to support deployment of new video monitoring services and applications.

Adaptive Joint Source-Channel Coding

As the deployment of video monitoring devices, applications, and services expands, the underlying network architecture is becoming very heterogeneous, requiring the support of video transmission over a variety of private and public networking infrastructure, including, but not limited to, wireline networks based on LAN, WAN, CATV, and IP technologies, fixed wireless networks, mobile wireless networks, and satellite networks.

Video transmission over mobile wireless networks represents one extreme challenge because of the higher data rates typically required, in comparison to the transmission of other data/media types such as text, audio, and still images. In addition, the limited and varying channel bandwidth, along with the fluctuating noise and error characteristics of mobile networks impose further constraints and difficulties on video transport. According to aspects of the present invention, various joint source-channel coding techniques can be applied to adapt the video bit stream to different channel conditions (see FIG. 9). Further, the joint source-channel coding approach of the present invention can be scalable, so as to adapt to varying channel bandwidths and error characteristics. Furthermore, it supports scalability for multicast scenarios, in which different devices at the receiving end of the video stream may have different limitations on decoding computational power and display capabilities.

Figure 9A:
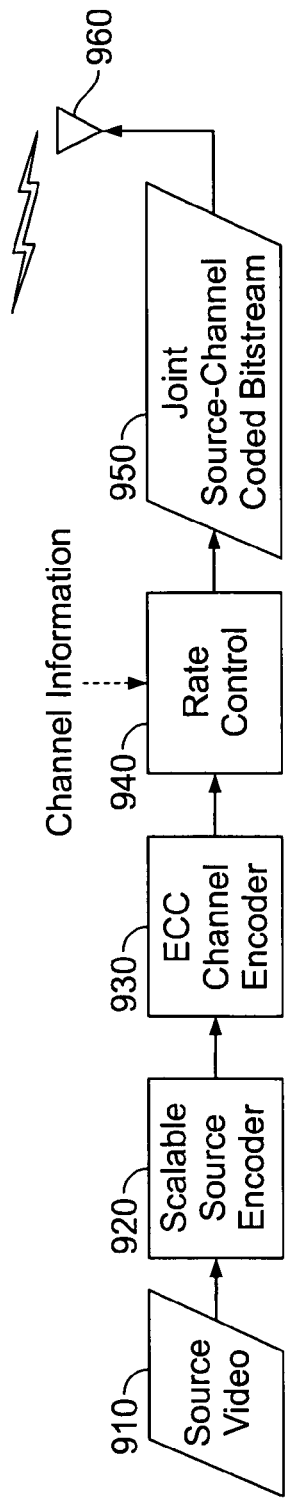
FIG. 9 illustrates a system for joint source-channel coding.

As shown in FIG. 9, and pursuant to aspects of the present invention, the source video sequence 910 is first source coded (i.e. compressed) by source encoder 920, followed by error correction code (ECC) channel coding 930. In prior art mobile networks, source coding typically uses such DCT-based compression techniques as, H.263, MPEG-4, or Motion JPEG. Such coding techniques could not be adjusted as can that of the present invention to provide real time adjustment of the degree of compression carried out in the source encoder. This aspect of the present invention provides significant advantages particularly when video is being captured, encoded and transmitted through the communications network in real or near real time (as compared to embodiments in which the video is captured, encoded and stored for later transmission). Exemplary channel coding methods are Reed-Solomon codes, BCH codes, FEC codes, and turbo codes. The joint source and channel coded video bit stream then passes through the rate controller 940 to match the channel bandwidth requirement while achieving the best reconstructed video quality. The rate controller performs discrete rate-distortion computations on the compressed video bit stream before it sends the video bit stream 950 for transmission over the channel 960. Due to limitations in computational power in mobile devices, typical rate controllers only consider the available channel bandwidth, and do not explicitly consider the error characteristics of the transmission channel 960. According to aspects of the present invention, the source encoder has the capability of adjusting the compression so as to achieve variations in the compression ratio as small as from 1 to 5% and also from 1 to 10%. This is particularly enabled when varied compression factors are applied to separate subbands of data that together represent the data of one or more video images.

Figure 9B:
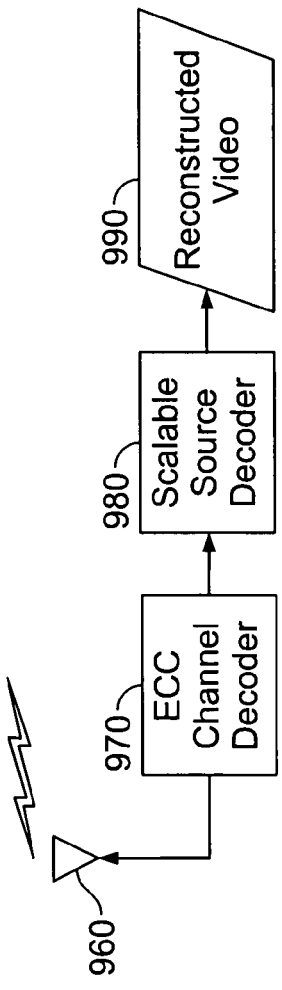

During decoding, as shown in FIG. 9b, the joint source-channel coded bitstream 950 is received over channel 960 and ECC channel decoded in step 970, source decoded in step 980 to render reconstructed video 990.

The present invention provides improved adaptive joint-source channel coding based on algorithms with higher computational efficiency, so that both instantaneous and predicted channel bandwidth and error conditions can be utilized in all three of the source coder 920, the channel coder 930, and the rate controller 940 to maximize control of both the instantaneous and average quality (video rate vs. distortion) of the reconstructed video signal 990.

The improved adaptive joint-source channel coding technique provided by the present invention further allows wireless carriers and MMS service providers the ability to offer a greater range of quality-of-service (QoS) performance and pricing levels to their consumer and enterprise customers, thus maximizing the revenues generated using their wireless network infrastructure.

Multicast scenarios require a single adaptive video bit stream that can be decoded by many users. This is especially important in modern, large-scale, heterogeneous networks, in which network bandwidth limitations make it impractical to transmit multiple simulcast video signals specifically tuned for each user. Multicasting of a single adaptive video bit stream greatly reduces the bandwidth requirements, but requires generating a video bit stream that is decodable for multiple users, including high-end users with broadband wireless or wire line connections, and wireless phone users, with limited bandwidth and error-prone connections. Due to limitations in computational power in mobile devices, the granularity of adaptive rate controllers is typically very coarse, for example producing only a 2-layer bit stream including a base layer and one enhancement layer.

Another advantage provided by the present invention's improved adaptive joint-source channel coding based on algorithms with higher computational efficiency is that it enables support for a much higher level of network heterogeneity, in terms of channel types (wireless and wire line), channel bandwidths, channel noise/error characteristics, user devices, and user services.

Mobile JAVA Applications

JAVA technology brings a wide range of devices, from servers and desktop computers to network cameras and mobile devices, together under one language and one technology. While the applications for this range of devices differ, JAVA technology works to bridge those differences where it counts, allowing developers who are functional in one area to leverage their skills across the spectrum of devices and applications.

First introduced to the JAVA community by Sun Microsystems, Inc. in June 1999, J2ME (JAVA 2, Micro Edition) was part of a broad initiative to better meet the diverse needs of JAVA developers. With the JAVA 2 Platform, Sun Microsystems, Inc. redefined the architecture of the JAVA technology, grouping it into three editions. Standard Edition (J2SE) offered a practical solution for desktop development and low-end business applications. Enterprise Edition (J2EE) was for developers specializing in applications for the enterprise environment. Micro Edition (J2ME) was introduced for developers working devices with limited hardware resources, such as PDAs, cell phones, pagers, television set top boxes, networked cameras, remote telemetry units, and many other consumer electronic and embedded devices.

J2ME is aimed at machines with as little as 128 KB of RAM and with processors a lot less powerful than those used on typical desktop and server machines. J2ME actually consists of a set of profiles. Each profile is defined for a particular type of device—cell phones, PDAs, etc.—and consists of a minimum set of class libraries required for the particular type of device and a specification of a JAVA virtual machine required to support the device. The virtual machine specified in any J2ME profile is not necessarily the same as the virtual machine used in JAVA 2 Standard Edition (J2SE) and JAVA 2 Enterprise Edition (J2EE).

It's clearly impossible to define a single J2ME technology that would be optimal, or even close to optimal, for all of the devices listed above. The differences in processor power, memory, persistent storage, and user interface are simply too severe. To address this problem, Sun Microsystems, Inc. divided and then subdivided the definition of devices suitable for J2ME into sections. With the first slice, Sun Microsystems, Inc. divided devices into two broad categories based on processing power, memory, and storage capability, with no regard for intended use. The company then defined a stripped-down version of the JAVA language that would work within the constraints of the devices in each category, while still providing at least minimal JAVA language functionality.

Next, Sun Microsystems, Inc. identified within each of these two categories classes of devices with similar roles. For example, all cell phones fell within one class, regardless of manufacturer. With the help of its partners in the JAVA Community Process (JCP), Sun Microsystems, Inc. then defined additional functionality specific to each vertical slice.

The first division created two J2ME configurations: Connected Device Configuration (CDC) and Connected, Limited Device Configuration (CLDC). A configuration is a JAVA virtual machine (JVM) and a minimal set of class libraries and APIs providing a run-time environment for a select group of devices. A configuration specifies a least common denominator subset of the JAVA language, one that fits within the resource constraints imposed by the family of devices for which it was developed. Because there is such great variability across user interface, function, and usage, even within a configuration, a typical configuration doesn't define such important pieces as the user interface toolkit and persistent storage APIs. The definition of that functionality belongs, instead, to what is called a profile.

A J2ME profile is a set of JAVA APIs specified by an industry-led group that is meant to address a specific class of device, such as pagers and cell phones. Each profile is built on top of the least common denominator subset of the JAVA language provided by its configuration, and is meant to supplement that configuration. Two profiles important to mobile handheld devices are: the Foundation profile, which supplements the CDC, and the Mobile Information Device Profile (MIDP), which supplements the CLDC. More profiles are in the works, and specifications and reference implementations should begin to emerge soon.

The JAVA Technology for the Wireless Industry (JTWI) specification, JSR 185, defines the industry-standard platform for the next generation of JAVA technology-enabled mobile phones. JTWI is defined through the JAVA Community Process (JCP) by an expert group of leading mobile device manufacturers, wireless carriers, and software vendors. JTWI specifies the technologies that must be included in all JTWI-compliant devices: CLDC 1.0 (JSR 30), MIDP 2.0 (JSR 118), and WMA 1.1 (JSR 120), as well as CLDC 1.1 (JRS 139) and MMAPI (JSR 135) where applicable. Two additional JTWI specifications that define the technologies and interfaces for mobile multimedia devices are JSR-135 ("Mobile Media API") and JSR-234 ("Advanced Multimedia Supplements").

The JTWI specification raises the bar of functionality for high-volume devices, while minimizing API fragmentation and broadening the substantial base of applications that have already been developed for mobile phones. Benefits of JTWI include:

Interoperability: The goal of this effort is to deliver a predictable environment for application developers, and a deliverable set of capabilities for device manufacturers. Both benefit greatly by adopting the JTWI standard: manufacturers from a broad range of compatible applications, software developers from a broad range of devices that support their applications.

Clarification of security specification: The JSR 185 specification introduces a number of clarifications for untrusted applications with regard to the "Recommended Security Policy for GSM/UMTS-Compliant Devices" defined in the MIDP 2.0 specification. It extends the base MIDlet suite security framework defined in MIDP 2.0.

Road map: A key feature of the JTWI specification is the road map, an outline of common functionality that software developers can expect in JTWI-compliant devices. January 2003 saw the first in a series of road maps expected to appear at six- to nine-month intervals, which will describe additional functionality consistent with the evolution of mobile phones. The road map enables all parties to plan for the future with more confidence: carriers can better plan their application deployment strategy, device manufacturers can better determine their product plans, and content developers can see a clearer path for their application development efforts. Carriers in particular will, in the future, rely on a Java VM to abstract/protect underlying radio/network functions from security breaches such as viruses, worms, and other "attacks" that currently plaque the public Internet.

Road map: A key feature of the JTWI specification is the road map, an outline of common functionality that software developers can expect in JTWI-compliant devices. January 2003 saw the first in a series of road maps expected to appear at six- to nine-month intervals, which will describe additional functionality consistent with the evolution of mobile phones. The road map enables all parties to plan for the future with more confidence: carriers can better plan their application deployment strategy, device manufacturers can better determine their product plans, and content developers can see a clearer path for their application development efforts. Carriers in particular will, in the future, rely on a JAVA VM to abstract/protect underlying radio/network functions from security breaches such as viruses, worms, and other "attacks" that currently plaque the public Internet.

According to aspects of the present invention, the previously described video codec and imaging application for video monitoring is Java-based to allow for "write-once, run-anywhere" portability across a broad range of Java-enabled digital video cameras and wireless handsets, as well as for Java VM security and device/network robustness against viruses, worms, and other mobile network security "attacks", and simplified OTA codec download procedures. According to further aspects, the Java-based imaging application conforms to JTWI specifications JSR-135 ("Mobile Media API") and JSR-234 ("Advanced Multimedia Supplements").

According to aspects of the present invention, the previously described video codec and imaging application for video monitoring is JAVA-based to allow for "write-once, run-anywhere" portability across a broad range of JAVA-enabled digital video cameras and wireless handsets, as well as for JAVA VM security and device/network robustness against viruses, worms, and other mobile network security "attacks", and simplified OTA codec download procedures. According to further aspects, the JAVA-based imaging application conforms to JTWI specifications JSR-135 ("Mobile Media API") and JSR-234 ("Advanced Multimedia Supplements").

The deployment video monitoring applications and services across heterogeneous networks has exposed fundamental limitations of current video compression technologies. On the one hand, such video monitoring applications and services are being launched into a market that now equates video with professional quality broadcast—full size image formats such as VGA and D1 at 30 frames per second. On the other hand, processing of such large volumes of data using existing video technologies originally developed for broadcasting and streaming applications greatly exceeds the computing resources and battery power available for real-time video capture (encoding) and analysis in devices such as digital network cameras and mobile handsets. Broadcast and streaming applications rely on the encoding of video content in a studio environment, where high-complexity encoders can be run on computer workstations. Since video messages must be captured in real time in the digital video monitoring cameras and wireless handsets themselves, they are limited to much smaller sizes and much lower frame rates.

As a result, today's network camera and mobile video imaging services are primitive; pictures are small ($\leq$CIF) and choppy ($\leq$15 fps) in comparison to those that users have long come to expect from analog CCTV cameras and consumer digital camcorders. Video monitoring system users are demanding full VGA/D1, 30 fps performance before they will widely adopt and pay premium pricing for digital video monitoring system upgrades and new deployments.

Even after far more expensive and time-consuming development programs, competing video codec providers can still only offer complex hybrid software codec+hardware accelerator solutions for VGA/D1 30 fps performance, with overall cost and power consumption that far exceed commercial business requirements and technology capabilities. Digital network cameras and wireless handsets are thus limited to small choppy images or expensive power-hungry architectures.

Upgrading fixed video monitoring network and wireless MMSC infrastructure is also costly if new hardware is required. An all-software ASP platform would be preferable in order to enable automated OTA/OTN upgrade and management of network cameras, wireless handsets, and MMSC video gateways.

Improved Wavelet-Based Image Processing

Figure 10:
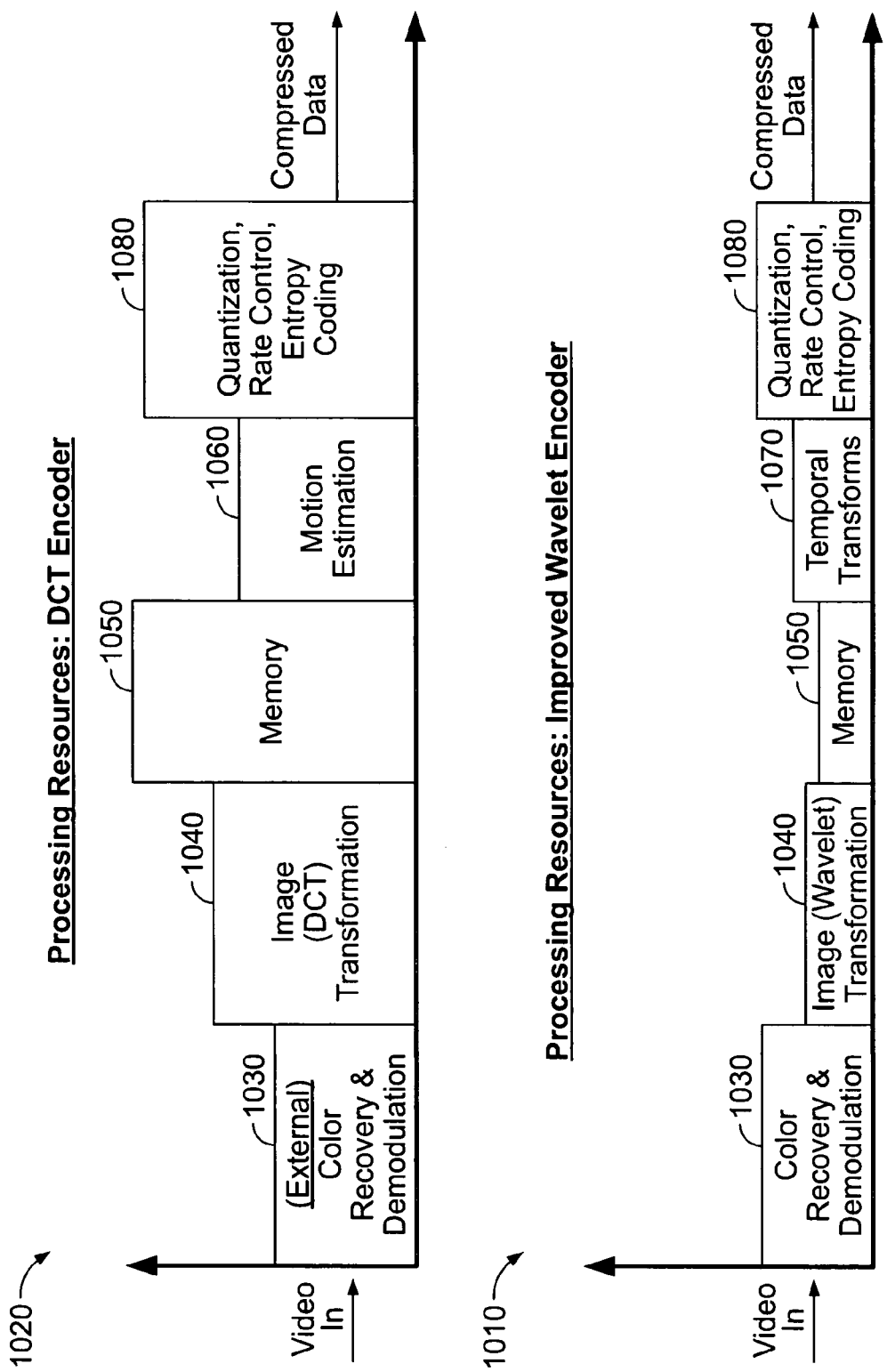
FIG. 10 schematically compares the differences in processing resources between a DCT encoder and an improved wavelet encoder of the present invention.

According to one aspect of the present invention, 3-D wavelet transforms can be exploited to design video compression/decompression (codec) devices 1010 much lower in computational complexity than DCT-based codecs 1020 (see FIG. 10). Processing resources used by such processes as color recovery and demodulation 1030, image transformation 1040, memory 1050, motion estimation 1060/temporal transforms 1070, and quantization, rate control and entropy coding 1080 can be significantly reduced by utilizing 3-D wavelet codecs according to some aspects of the present invention. The application of a wavelet transform stage also enables design of quantization and entropy-coding stages with greatly reduced computational complexity. Further advantages of the 3-D wavelet codecs 1010 according to certain aspects of the present invention developed for mobile imaging applications, devices, and services include:

Symmetric, low-complexity video encoding and decoding

Lower processor power requirements for both software and hardware codec implementations All-software encoding and decoding of VGA (or larger) video at a frame rate of 30 fps (or higher) with processor requirements compatible with existing commercial mobile handsets, both as native code and as a Java application Lower gate-count ASIC cores for SoC integration Lower buffer memory requirements Single codec supports both still images (~JPEG) and video (~MPEG)

Simplified video editing (cuts, inserts, text overlays) due to shorter group of pictures (GOP)

Simplified synchronization with voice codecs, due to shorter GOP

Low latency for enhanced video streaming, due to shorter GOP

Fine grain scalability for adaptive rate control, multicasting, and joint source-channel coding Low-complexity performance scaling to emerging HDTV video formats All-software encoding and decoding of VGA (or larger) video at a frame rate of 30 fps (or higher) with processor requirements compatible with existing commercial mobile handsets, both as native code and as a JAVA application.

According to aspects of the present invention, the above advantages are achieved by our unique combination of technologies as follows.

Wavelet transforms using short dyadic integer filter coefficients in the lifting structure: for example, the Haar, 2-6, and 5-3 wavelets and variations of them can be used. These use only adds, subtracts, and small fixed shifts—no multiplication or floating-point operations are needed.

Lifting Scheme computation: The above filters can advantageously be computed using the Lifting Scheme which allows in-place computation. A full description of the Lifting Scheme can be found in Sweldens, Wim, The Lifting Scheme: A custom-design construction of biorthogonal wavelets. Appl. Comput. Harmon. Anal. 3(2):186-200, 1996, incorporated herein by reference in its entirety. Implementing the Lifting Scheme in this application minimizes use of registers and temporary RAM locations, and keeps references local for highly efficient use of caches.

Wavelet transforms in pyramid form with customized pyramid structure: each level of the wavelet transform sequence can advantageously be computed on half of the data resulting from the previous wavelet level, so that the total computation is almost independent of the number of levels. The pyramid can be customized to leverage the advantages of the Lifting Scheme above and further economize on register usage and cache memory bandwidth.

Block structure: in contrast to most wavelet compression implementations, the picture can advantageously be divided into rectangular blocks with each block being processed separately from the others. This allows memory references to be kept local and an entire transform pyramid can be done with data that remains in the processor cache, saving a lot of data movement within most processors. Block structure is especially important in hardware embodiments as it avoids the requirement for large intermediate storage capacity in the signal flow.

Block boundary filters: modified filter computations can be advantageously used at the boundaries of each block to avoid sharp artifacts, as described in applicants' U.S. application Ser. No. 10/418,363, filed Apr. 17, 2003, published as 2003/0198395 and entitled WAVELET TRANSFORM SYSTEM, METHOD AND COMPUTER PROGRAM PRODUCT, incorporated herein by reference in its entirety.

Chroma temporal removal: in certain embodiments, processing of the chroma-difference signals for every field can be avoided, instead using a single field of chroma for a GOP. This is described in applicants' U.S. application Ser. No. 10/447,514, filed May 28, 2003, published as 2003/0235340 and entitled CHROMA TEMPORAL RATE REDUCTION AND HIGH-QUALITY PAUSE SYSTEM AND METHOD, incorporated herein by reference in its entirety.

Temporal compression using 3D wavelets: in certain embodiments, the very computationally expensive motion-search and motion-compensation operations of conventional video compression methods such as MPEG are not used. Instead, a field-to-field temporal wavelet transform can be computed. This is much less expensive to compute. The use of short integer filters with the Lifting Scheme here is also preferred.

Dyadic quantization: in certain embodiments, the quantization step of the compression process is accomplished using a binary shift operation uniformly over a range of coefficient locations. This avoids the per-sample multiplication or division required by conventional quantization.

Piling: in certain embodiments, the amount of data to be handled by the entropy coder is reduced by first doing a run-of-zeros conversion. Preferably, a method of counting runs of zeros on parallel processing architectures is used, as described in applicants' U.S. application Ser. No. 10/447,455, filed May 28, 2003, published as 2003/0229773 and entitled PILE PROCESSING SYSTEM AND METHOD FOR PARALLEL PROCESSORS, incorporated herein by reference in its entirety. Note that most modern processing platforms have some parallel capability that can be exploited in this way.

Cycle-efficient entropy coding: in certain embodiments, the entropy coding step of the compression process is done using techniques that combine the traditional table lookup with direct computation on the input symbol. Characterizing the symbol distribution in source still images or video leads to the use of such simple entropy coders as Rice-Golomb, exp-Golomb or the Dyadic Monotonic. The choice of entropy coder details will often vary depending on the processor platform capabilities. Details of the Rice-Golomb and exp-Golomb coders are described in: Golomb, S. W. (1966), "Run-length encodings", IEEE Transactions on Information Theory, IT-12(3):399-401; R. F. Rice, "Some Practical Universal Noiseless Coding Techniques," Jet Propulsion Laboratory, Pasadena, Calif., JPL Publication 79-22, March 1979; and J. Teuhola, "A Compression Method for Clustered Bit-Vectors," Information Processing Letters, vol. 7, pp. 308-311, October 1978 (introduced the term "exp-Golomb"). Details of the Dyadic Monotonic coder are described in applicants' U.S. Pat. No. 6,847,317, issued Jan. 25, 2005 and entitled SYSTEM AND METHOD FOR A DYADIC-MONOTONIC (DM) CODEC. Each of the above references is incorporated herein by reference in its entirety.

Rate Control

One method of adjusting the amount of compression, the rate of output bits produced, is to change the amount of information discarded in the quantization stage of the computation. Quantization is conventionally done by dividing each coefficient by a pre-chosen number, the "quantization parameter", and discarding the remainder of the division. Thus a range of coefficient values comes to be represented by the same single value, the quotient of the division.

When the compressed image or GOP is decompressed, the inverse quantization process step multiplies the quotient by the (known) quantization parameter. This restores the coefficients to their original magnitude range for further computation.

However, division (or equivalently multiplication) is an expensive operation in many implementations, in terms of power and time consumed, and in hardware cost. Note that the quantization operation is applied to every coefficient, and that there are usually as many coefficients as input pixels.

In another method, instead of division (or multiplication), quantization is limited to divisors that are powers of 2. This has the advantage that it can be implemented by a bit-shift operation on binary numbers. Shifting is very much less expensive operation in many implementations. An example is integrated circuit (FPGA or ASIC) implementation; a multiplier circuit is very large, but a shifter circuit is much smaller. Also, on many computers, multiplication requires longer time to complete, or offers less parallelism in execution, compared to shifting.

While quantization by shifting is very efficient with computation, it has a disadvantage for some purposes: it only allows coarse adjustment of the compression rate (output bit rate). According to aspects of the present invention, it is observed in practice that changing the quantization shift parameter by the smallest possible amount, +1 or −1, results in nearly a 2-fold change in the resulting bit rate. For some applications of compression, this may be acceptable. For other applications, finer rate control is required.

In order to overcome the above coarseness problem of the prior art without giving up the efficiency of shift quantization, the quantization is generalized. Instead of using, as before, a single common shift parameter for every coefficient, we provide for a distinct shift parameter to be applied to each separate run-of-zeros compressed storage area or pile. The parameter value for each such area or pile is recorded in the compressed output file. A pile is a data storage structure in which data are represented with sequences of zeros (or of other common values) compressed. It should be noted that a subband may comprise several separate piles or storage areas. Alternately, a pile or storage area may comprise several separate subbands.

This solution now allows a range of effective bit rates in between the nearest two rates resulting from quantization parameters applied uniformly to all coefficients. For example, consider a case in which all subbands but one (subband x) use the same quantization parameter, Q, and that one (subband x) uses Q+1. The resulting overall bit rate from the quantization step is reduced as compared to using Q for all subbands in the quantization, but not to the degree as if Q+1 were used for all subbands. This provides an intermediate bit rate between that achieved by uniform application of Q or Q+1, giving a better, finer control of the compression.

Note that the computational efficiency is almost exactly that of pure shift quantization, since typically the operation applied to each coefficient is still a shift. Any number of subbands can be used. Four to one-hundred subbands are typical. Thirty-two is most typical. Further information on rate control is provided in applicants' U.S. application Ser. No. 11/232,165 filed Sep. 20, 2005 entitled COMPRESSION RATE CONTROL SYSTEM AND METHOD WITH VARIABLE SUBBAND PROCESSING, incorporated herein by reference in its entirety.

Improved Adaptive Joint Source-Channel Coding

Referring now to FIG. 11, the fine grain scalability of the improved wavelet-based codec described above enables improved adaptive rate control, multicasting, and joint source-channel coding. The reduced computational complexity and higher computational efficiency of the improved wavelet algorithms allows information on both instantaneous and predicted channel bandwidth and error conditions to be utilized in all three of the source coder 1120, the channel coder 1130, and the rate controller 1140 to maximize control of both the instantaneous and average compression rates which affect the quality (video rate vs. distortion) of the reconstructed video signal 1190 (see FIG. 11). For example, available transmission bandwidth between a mobile device 810 and a cellular transmission tower 812 (shown in FIG. 8) can vary based on the number of users accessing the tower 812 at a particular time. Similarly, the quality of the transmission between the mobile phone 810 and tower 812 (i.e. error rate) can vary based on the distance and obstructions between the phone 810 and tower 812. Information on the currently available bandwidth and error rate can be received by the phone 810 and used to adjust the compression rate accordingly. For instance, when the bandwidth goes down and/or the error rate goes up, the compression rate (and therefore the associated reproduced picture quality) can be reduced so that the entire compressed signal can still be transmitted in real time. Conversely, when the available bandwidth increases and/or the error rate decreases, the compression rate can be decreased to allow for a higher quality picture to be transmitted. Based on this feedback, the compression rate can be adjusted by making real time processing changes in either the source encoder 1120, the channel encoder 1130 or the rate controller 1140, or with changes to a combination of these elements.

Example rate change increments can vary from 1 to 5%, from 1 to 10%, from 1 to 15%, from 1 to 25%, and from 1 to 40%

The improved adaptive joint-source channel coding technique allows video monitoring network operators, wireless carriers, and MMS service providers to offer a greater range of quality-of-service (QoS) performance and pricing levels to their customers. Utilizing improved adaptive joint-source channel coding based on algorithms with higher computational efficiency enables support for a much higher level of network heterogeneity, in terms of channel types (wireless and wire line), channel bandwidths, channel noise/error characteristics, user devices, and user services. The reduced computational complexity of the video codec also enables reductions in the complexity of corresponding video processing and analysis applications. Such applications can then be integrated much more readily together with the video codec using the limited computational resources available in network cameras and wireless handsets.

Improved Video Monitoring Camera Architecture

Figure 12:
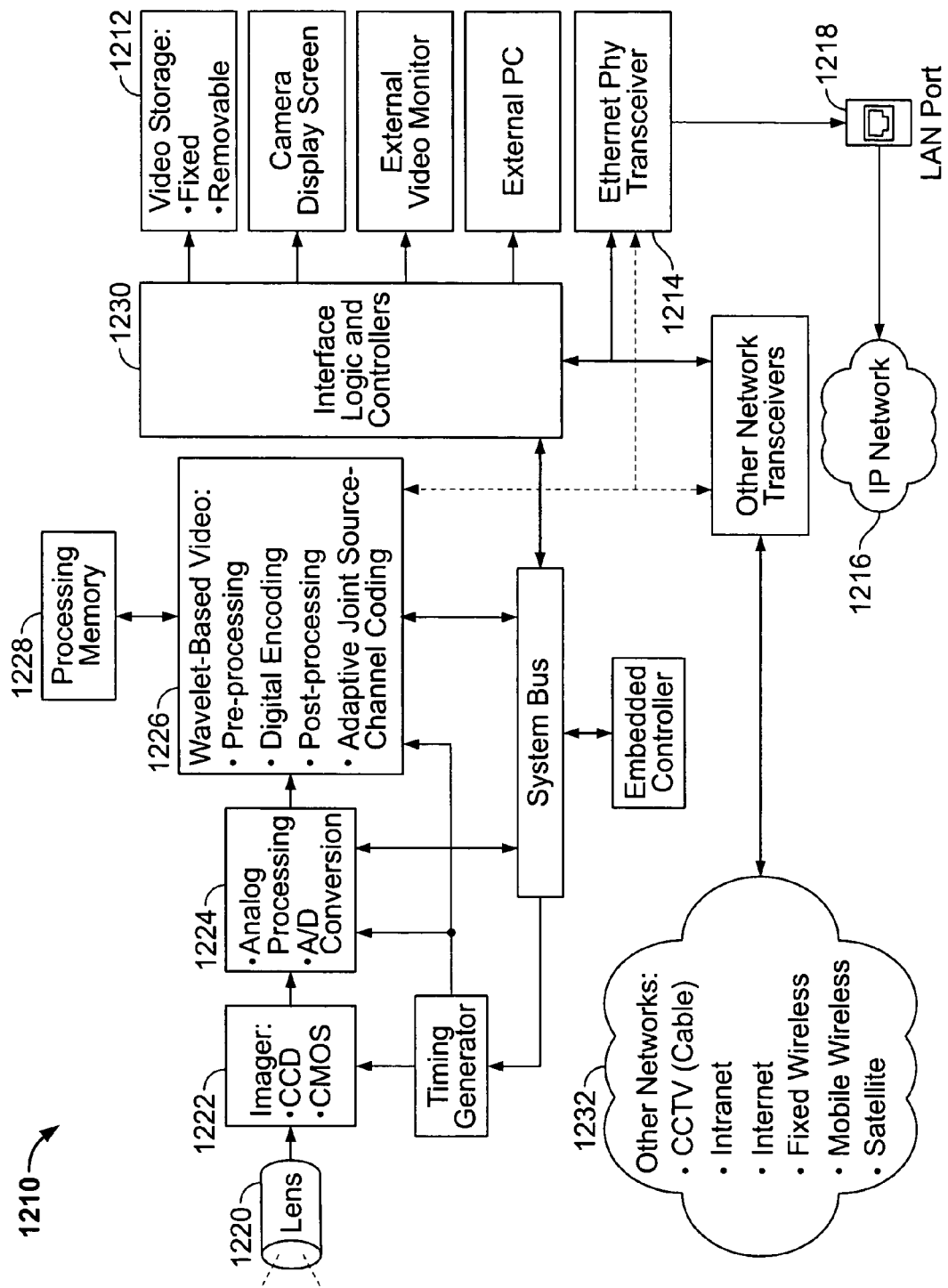
FIG. 12 illustrates an improved architecture of a digital monitoring camera with integrated IP network interface.

FIG. 12 illustrates an improved digital video monitoring camera architecture 1210 according to aspects of the present invention, with components similar to those in FIG. 5 labeled with similar reference numerals. As shown, the imaging application can be implemented as an all-software application running as native code or as a JAVA application on a RISC processor 1226 or DSP. Acceleration of the JAVA code operation may be implemented within the RISC processor 1226 itself, or using a separate JAVA accelerator IC. Such a JAVA accelerator may be implemented as a stand-alone IC, or this IC may be integrated with other functions in either a SIP or SoC.

The improved digital video monitoring camera architecture illustrated in FIG. 12 greatly reduces the computational and buffer memory 1228 requirements for the video codec and imaging application, supports processing of both still images and video, enables reductions in the complexity of corresponding video processing and analysis applications, enables such applications to be integrated with the video codec using the limited computational resources available in the network camera, and enables adaptive joint source-channel coding in support of connectivity over a much more heterogeneous range of network architectures 1232 and infrastructure equipment.

Improved Wireless Video Monitoring Device Platform Architecture

Figure 13:
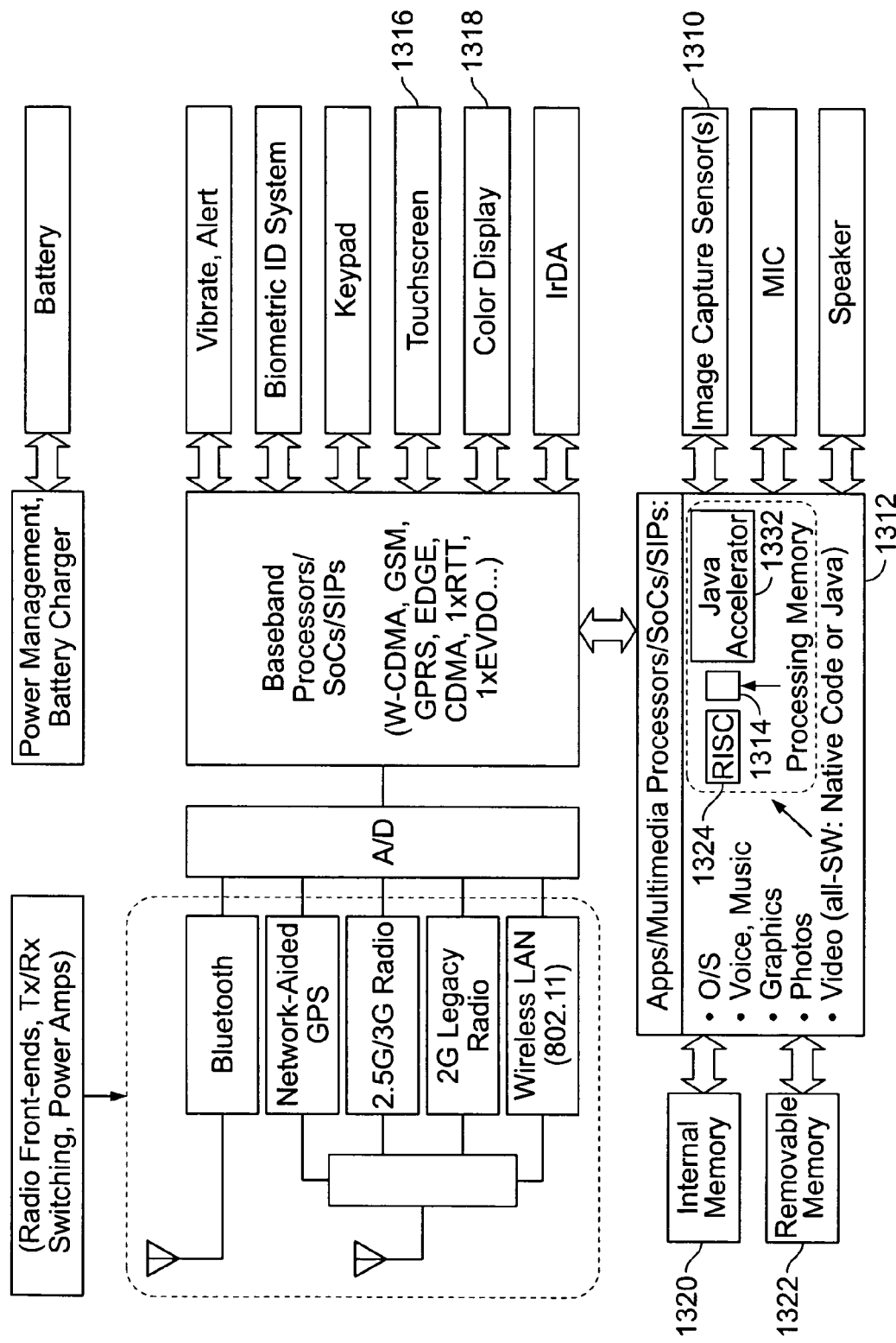
FIG. 13 illustrates an improved mobile imaging handset platform architecture.

FIG. 13 illustrates an improved mobile imaging handset platform architecture. The imaging application is implemented as an all-software application running as native code or as a JAVA application on a RISC processor 1324. Acceleration of the JAVA code operation may be implemented within the RISC processor 1324 itself, or using a separate JAVA accelerator IC 1332. Such a JAVA accelerator 1332 may be implemented as a stand-alone IC, or this IC may be integrated with other functions in either a SIP or SoC.

The improved mobile imaging handset platform architecture illustrated in FIG. 13 greatly reduces the computational and buffer memory 1314 requirements for the video codec and imaging application, supports processing of both still images and video, enables reductions in the complexity of corresponding video processing and analysis applications, enables such applications to be integrated with the video codec using the limited computational resources available in the network camera, and enables adaptive joint source-channel coding in support of connectivity over a much more heterogeneous range of network architectures and infrastructure equipment.

Improved Video Monitoring System Architecture

Figure 14:
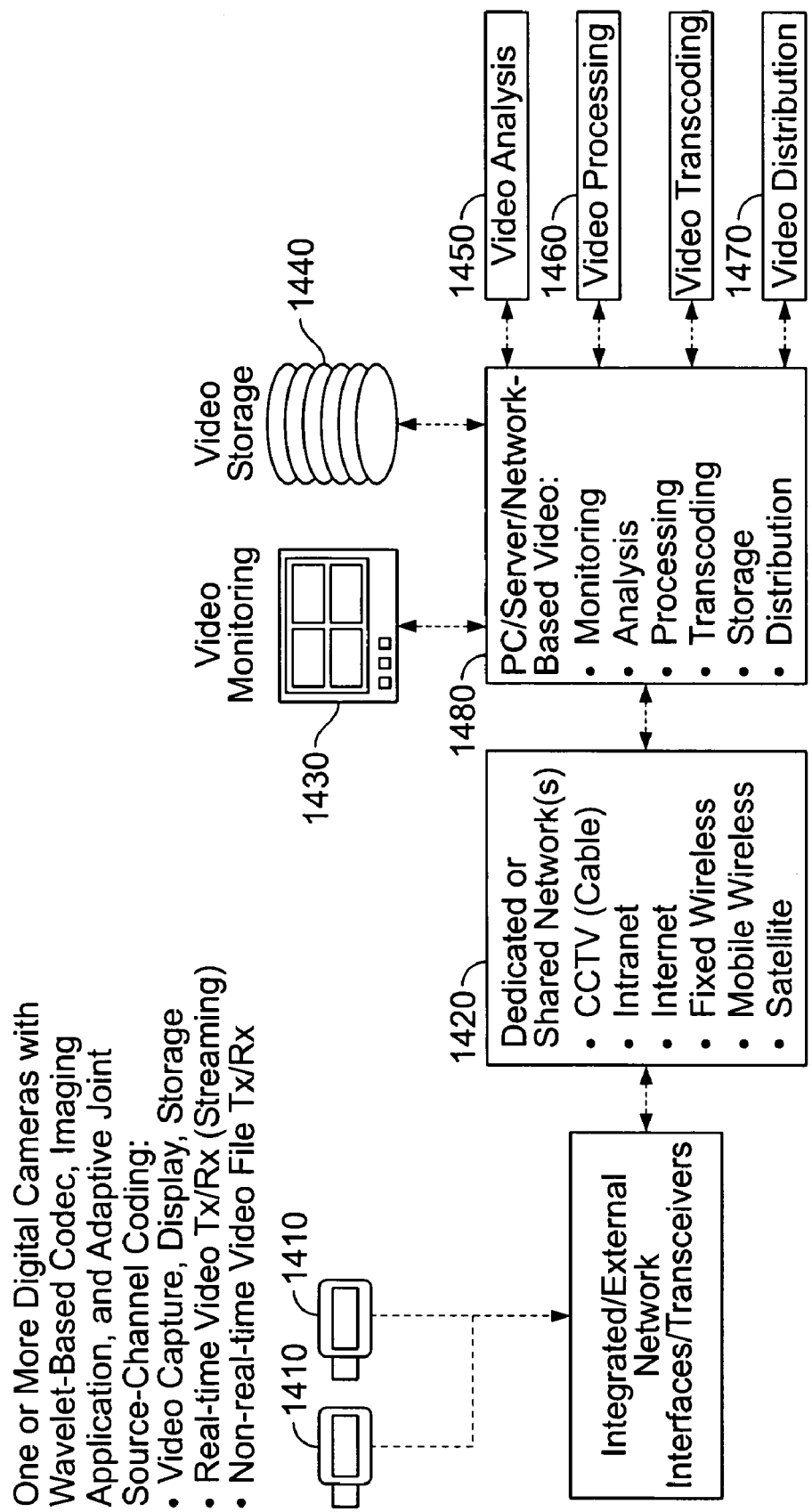
FIG. 14 illustrates an improved video monitoring system architecture using digital network cameras with integrated wavelet-based codec, imaging application, and joint source-channel coding.

FIG. 14 illustrates an improved video monitoring system architecture using digital network cameras 1410 with integrated wavelet-based codec, imaging application, and joint source-channel coding. This architecture allows video monitoring network operators to take advantage of new, more flexible, lower-cost, and higher-speed digital network transmission, storage, and processing technologies.

Figure 15:
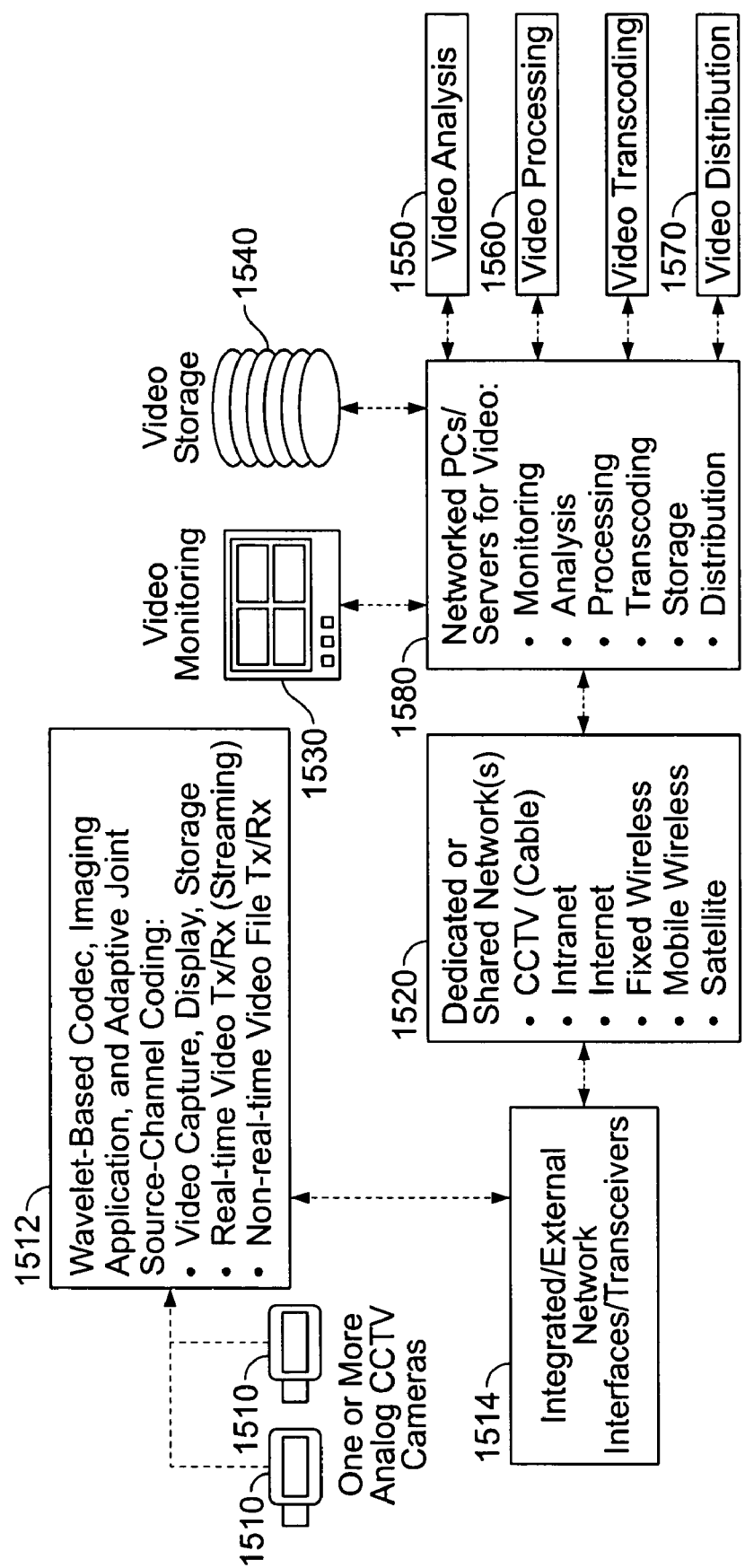
FIG. 15 illustrates an improved video monitoring system architecture using analog cameras and external wavelet-based codec, imaging application and joint source-channel coding.

FIG. 15 illustrates an improved video monitoring system architecture using analog cameras 1510 and external wavelet-based codec, imaging application, joint source-channel coding, and networking interfaces. This architecture allows video monitoring network operators to upgrade legacy video monitoring systems using analog CCTV cameras.

Figure 16:
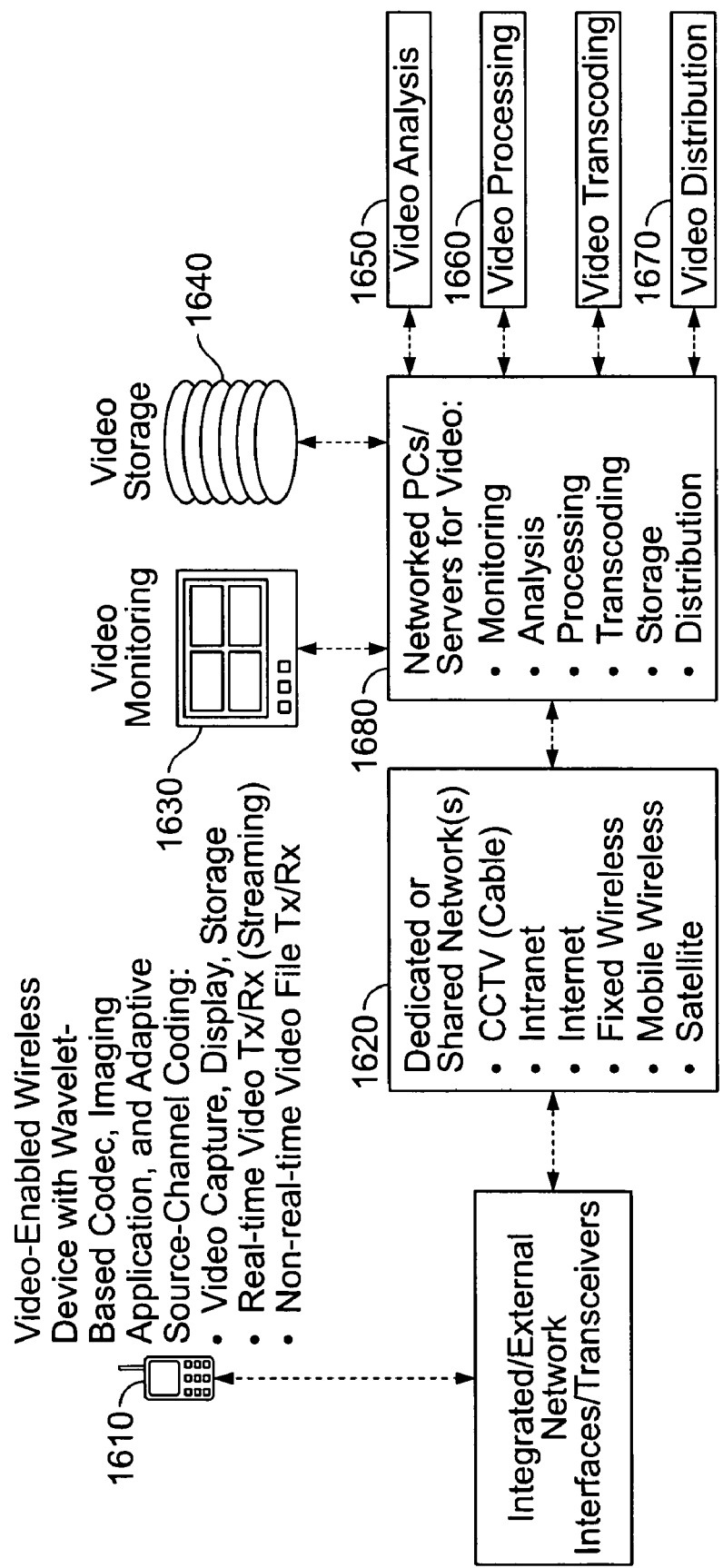
FIG. 16 illustrates an improved video monitoring system architecture using a video-enabled wireless device with integrated wavelet-based codec, imaging application, and joint source-channel coding.

FIG. 16 illustrates an improved video monitoring system architecture using video-enabled wireless device(s) 1610 with integrated wavelet-based codec, imaging application, and joint source-channel coding. This architecture allows video monitoring network operators to enable real-time capture, storage, display, transmission, reception, processing, and analysis of video over wireless devices connected to video monitoring networks.

All three of the above architectures enable delivery of higher quality digital video and images using network cameras and wireless devices with lower cost and complexity, reduced service deployment costs, and operation over a much more heterogeneous range of network architectures and infrastructure equipment.

Improved Mobile Video Monitoring System Architecture

Figure 17:
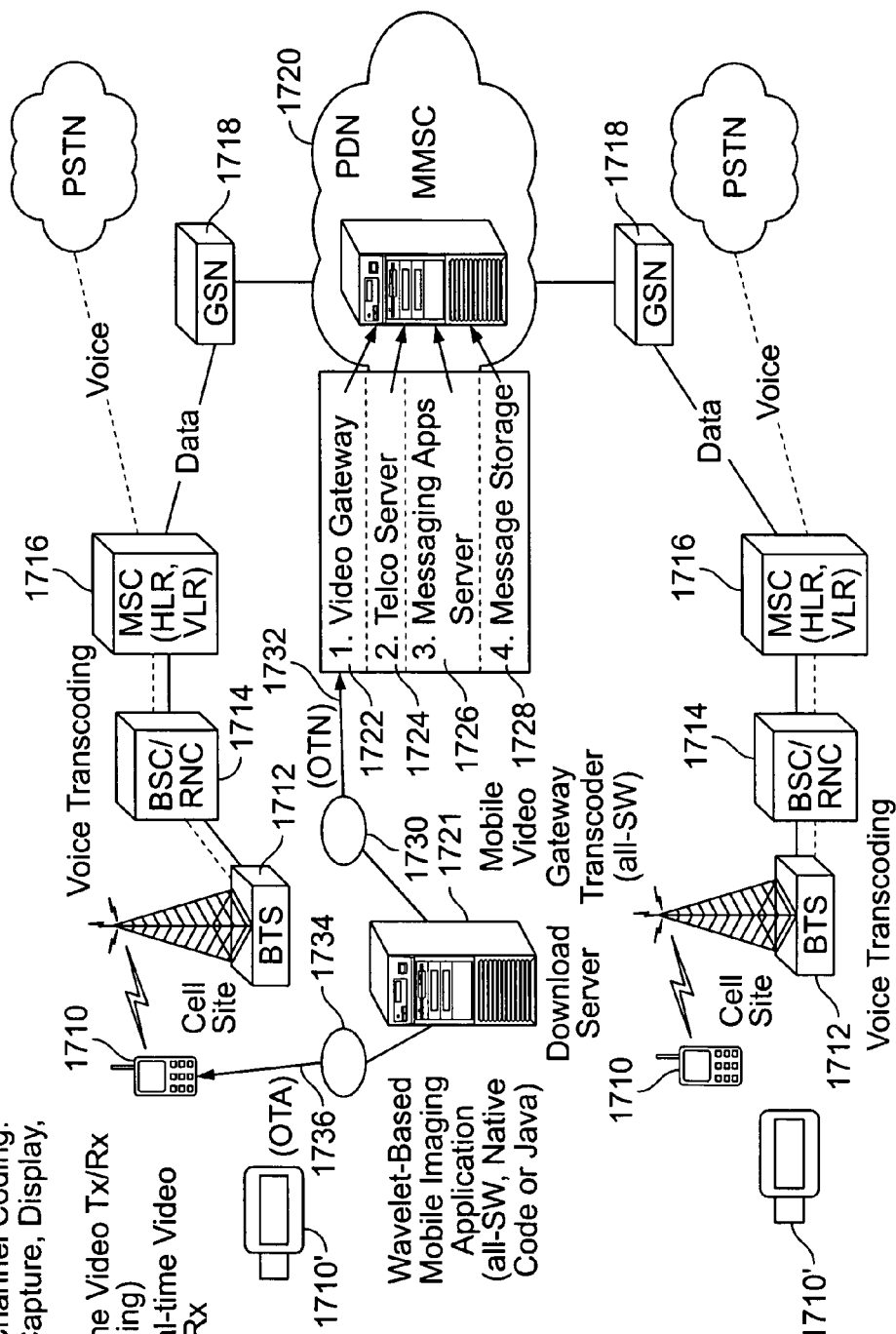
FIG. 17 illustrates an improved mobile imaging service platform architecture using a video-enabled wireless device with integrated wavelet-based codec, imaging application, and joint source-channel coding.
Figure 18:
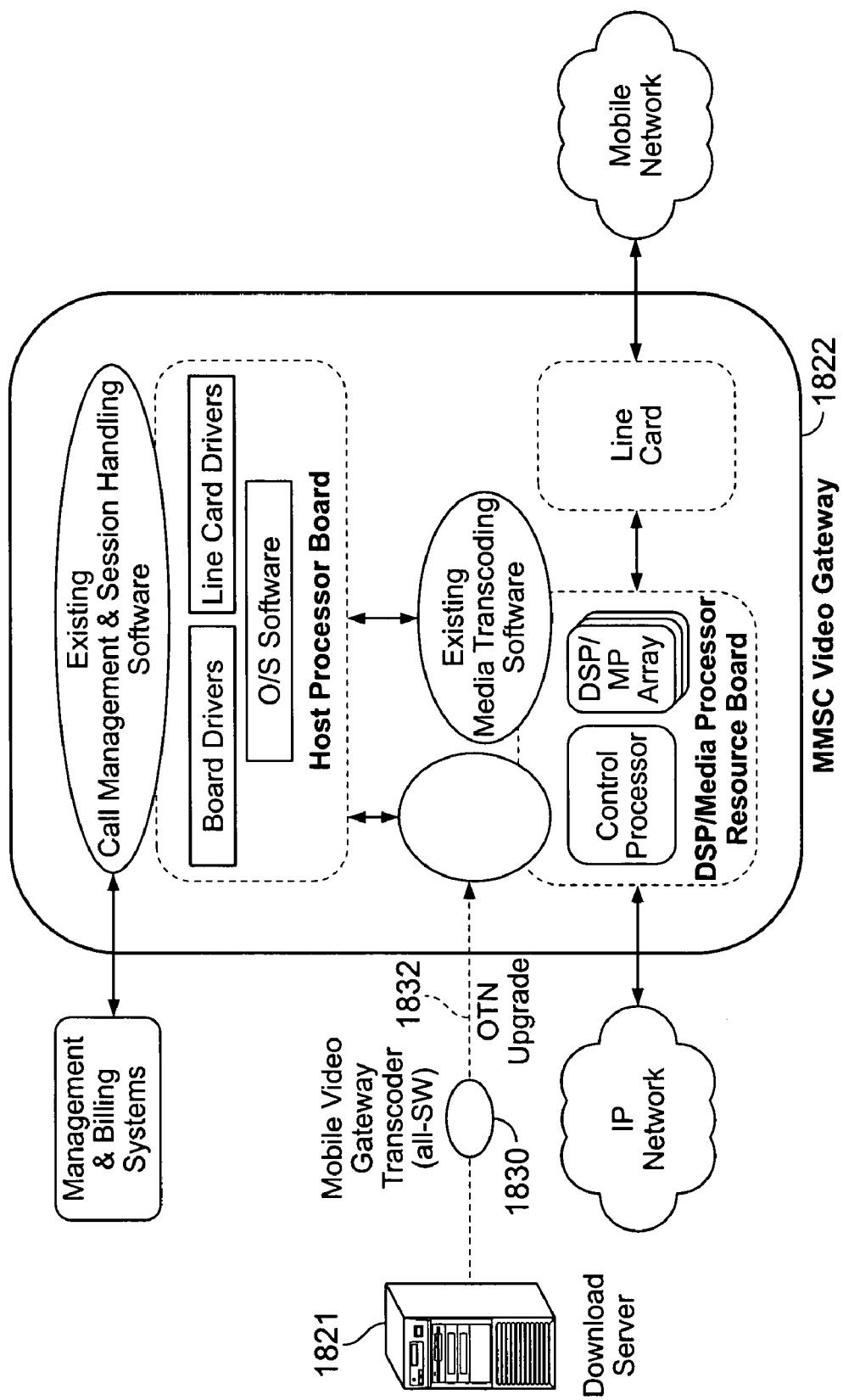
FIG. 18 illustrates an over-the-network upgrade of a deployed multimedia messaging service controller video gateway.

Referring to FIG. 17, key components of an improved mobile wireless network capable of supporting imaging services such as video monitoring can include:
  Mobile Handsets or Wireless Cameras 1710
  Mobile Basestations (BTS) 1712
  Basestation Controller/Radio Network Controller (BSC/RNC) 1714
  Mobile Switching Center (MSC) 1716
  Gateway Service Node (GSN) 1718
  Mobile Multimedia Service Controller (MMSC) 1720
  Imaging platform server 1734

Typical functions included in the MMSC (see FIG. 17) can include:
  Video gateway 1722
  Teleco server 1724
  MMS applications server 1726
  Storage server 1728

The video gateway 1722 in an MMSC 1720 serves to transcode between the different video formats that are supported by the imaging service platform. Transcoding is already utilized by wireless operators to support different voice codecs used in mobile telephone networks, and the corresponding voice transcoders are integrated into the RNC 1714.

The steps involved in deploying the improved imaging service platform include:
  Step 1.
  Signal the network that the Video Gateway Transcoder application 1730 is available for updating on the deployed Video Gateways 1722. In other words, when new transcoder software 1730 is available, the download server 1721 signals the video gateways 1722 on the network of this availability.
  Step 2.
  Install and configure Video Gateway Transcoder software application 1730 via automated OTN deployment 1732 or via manual procedures.
  Step 3.
  Signal wireless handset 1710 or digital monitoring camera 1710' and/or user that Mobile Video Imaging Application 1734 (e.g. an updated video codec) is available for download and installation.
  Step 4.
  If accepted by user, and transaction settlement is completed successfully, download and install Mobile Video Imaging Application 1734 to wireless handset 1710 or digital monitoring camera 1710' via OTA 1736 procedures. Just the encoder portion, just the decoder portion, or both the encoder and decoder portions of the Mobile Video Imaging Application 1734 can be downloaded and installed.
  Step 5.
  Signal network that wireless handset 1710 or digital monitoring camera 1710' upgrade is complete. Activate service and related applications. Update user billing records to reflect any new recurring charges for Mobile Video Imaging Application 1734.

The all-software wavelet-based video codec and imaging application, joint source-channel coding, network camera architecture, and wireless handset architecture are combined in the above wireless video monitoring service platform architecture to deliver higher digital video image quality using lower-cost and lower-complexity network cameras and wireless devices, reduced service deployment complexity, risk and costs via OTA/OTN deployment, and enable operation over a much more heterogeneous range of network architectures and infrastructure equipment.

Improved Video Monitoring/Messaging Applications and Services

The improved wavelet-based video codec and imaging application, joint source-channel coding, network camera architecture, wireless handset architecture, video monitoring network architectures, and wireless video monitoring service platform architecture described above also enable the deployment of the improved video monitoring and video messaging applications and services described below.

1. Multimedia Messaging Album: including, but not limited to, the following modules:
  MMS Composer: integrates improved wavelet-compressed images and videos with sounds and text in one message.
  Mobile Media Album: repository for wavelet-compressed images, videos, and integrated MMS messages.
  Mobile Media Box: MMS In- and Outbox
  Mobile Media Player: Preview of wavelet-compressed images, videos, and integrated MMS messages
  Subscription Management: Copy/forward and additional storage purchase.
  Address book: Contact management.
  Picture Editor: On-the-fly editing of wavelet-compressed images, videos, and integrated MMS messages with tools and filters.
  Multimedia Ring-Tone Composer: Create personal polyphonic ring tones that combine sound with wavelet-compressed images and videos.

Figure 22:
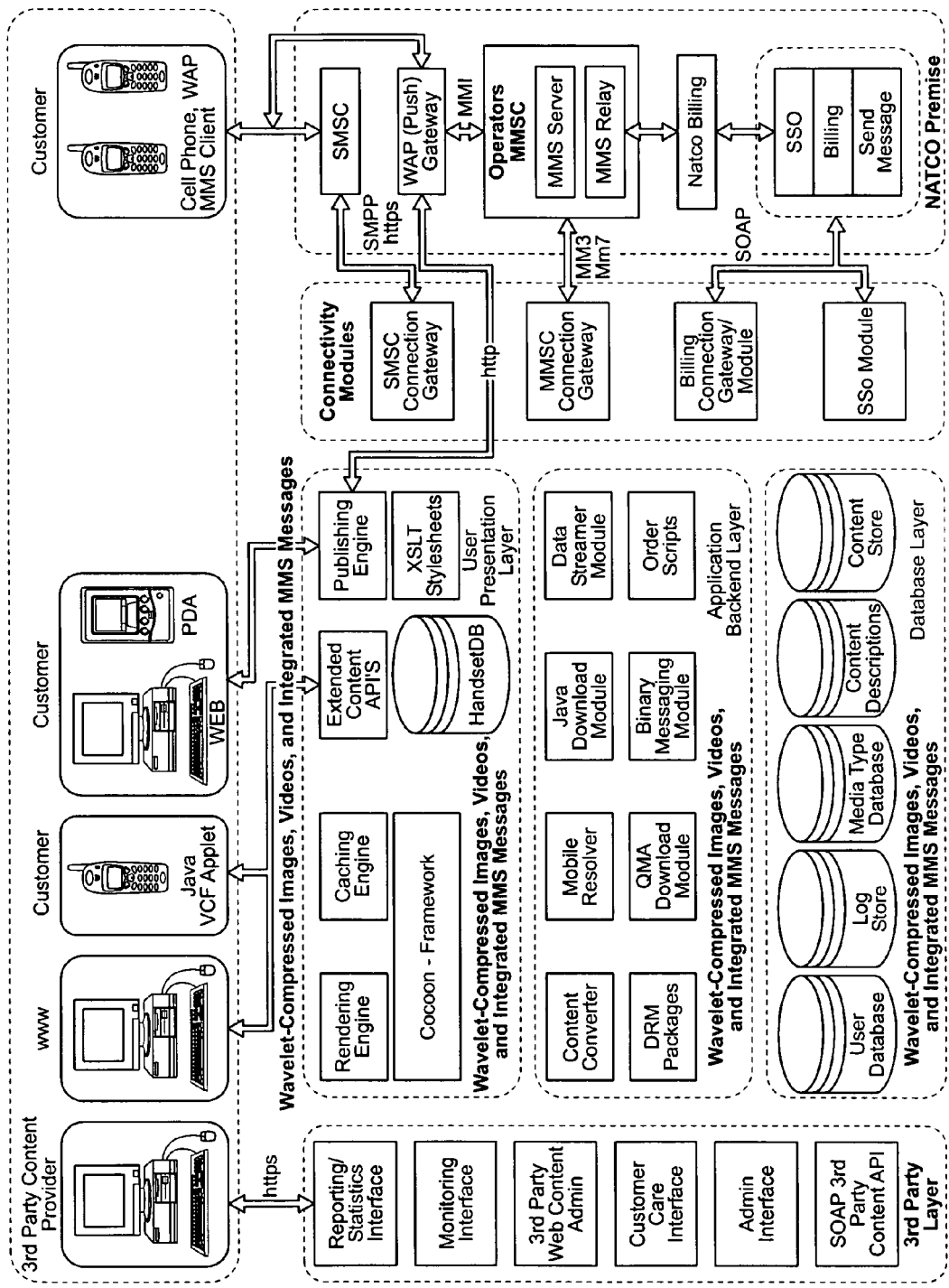
FIG. 22 illustrates an improved content delivery platform for management and delivery of wavelet-compressed images, videos, and integrated multimedia messaging service messages, and provisioning of multimedia messaging album applications.

2. Content Delivery Platform (see FIG. 22): management and delivery of wavelet-compressed images, videos, and integrated MMS messages; including, but not limited, to the following features:
  Centralized content storage
  Dynamic front-end rendering Support for multiple portals
Support for web, WAP and PDA based browsers
Premium-SMS support
Support for multiple delivery channels using SMS, MMS, WAP-Push, OMA-Download and J2ME download
Content to device mapping
Device management service
Content transcoding
Digital Rights Management (DRM) protection
Platform delivery via Applications Service Provider (ASP) business model Performance The improved wavelet-based video codec and imaging application, joint source-channel coding, network camera architecture, wireless handset architecture, video monitoring network architectures, wireless video monitoring service platform architecture, and video messaging/monitoring applications and services described here achieve the goal of delivering higher quality digital video and images using network cameras and wireless devices with lower cost and complexity, reduced service deployment costs, and operation over a much more heterogeneous range of network architectures and infrastructure equipment.

Enhancements

Figure 19:
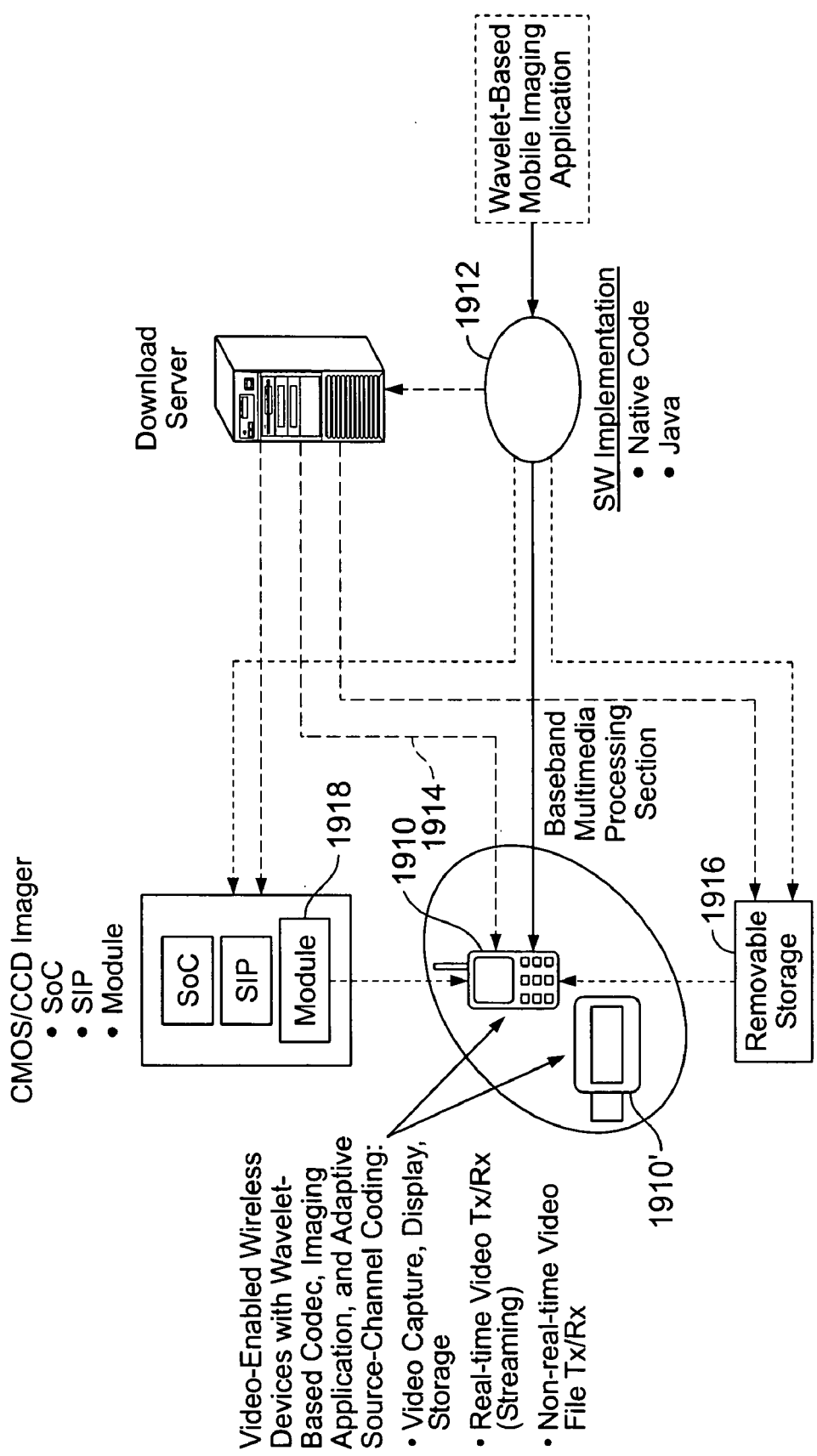
FIG. 19 illustrates implementation options for a software imaging application in a network camera or wireless handset.

Referring now to FIG. 19, as an enhancement to the network camera and mobile imaging handset architectures described above, in some embodiments several implementation options can be considered for the all-software wavelet-based imaging application. The imaging application can be installed via OTA download to the baseband multimedia processing section of the camera or handset, to a removable storage device, or to the imaging module or other location. Where desirable, the imaging application can also be installed during manufacturing or at point-of-sale to the baseband multimedia processing section of the camera or handset, to a removable storage device, or to the imaging module or other location. Additional implementation options are also possible as network camera and mobile device architectures evolve.

Figure 20:
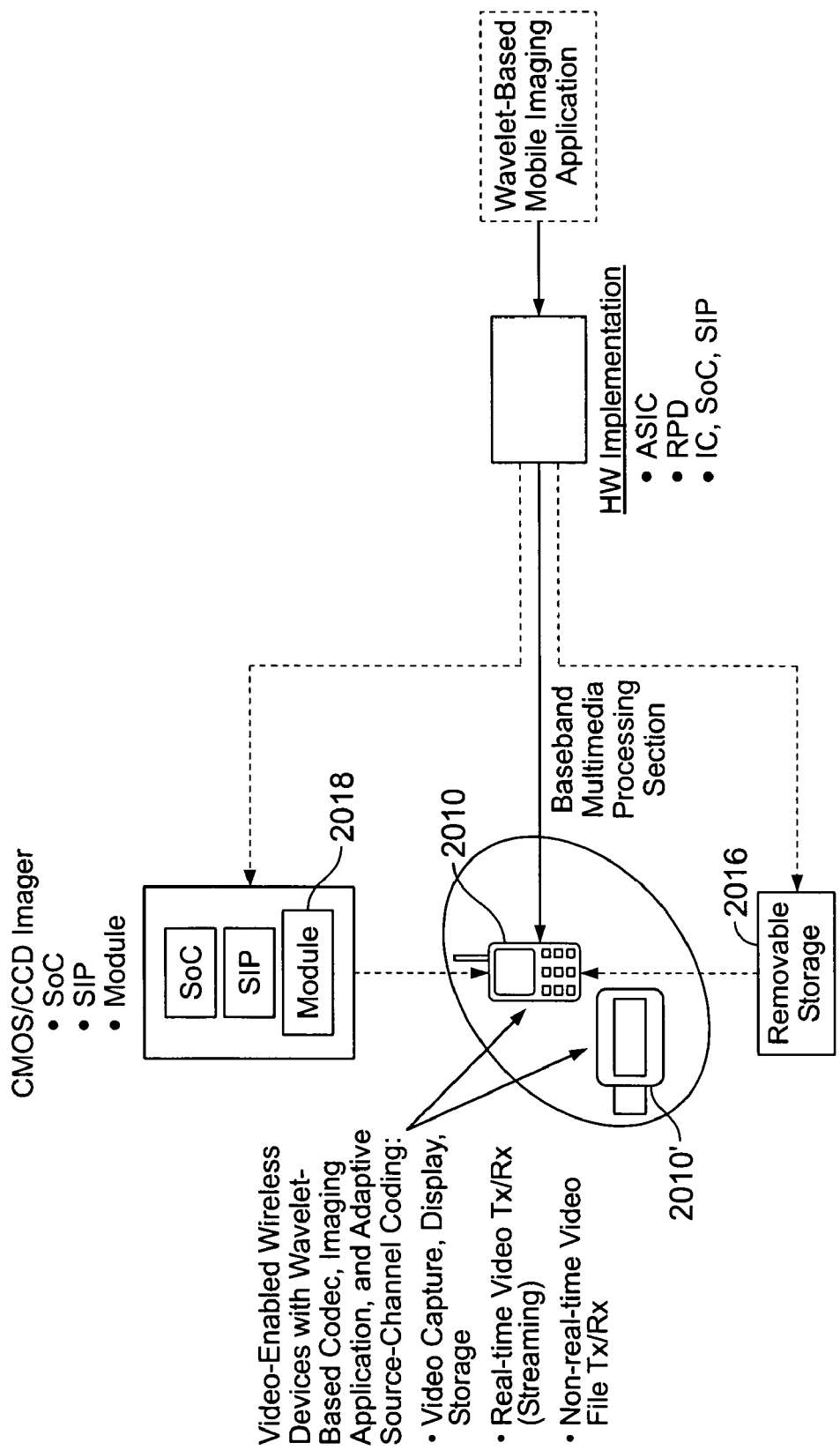
FIG. 20 illustrates implementation options for a hardware-accelerated imaging application in a network camera or wireless handset.

Performance of the network camera or mobile imaging handset may be further improved, and costs and power consumption may be further reduced, by accelerating some computational elements via hardware-based processing resources in order to take advantage of ongoing advances in mobile device computational hardware (ASIC, DSP, RPD) and integration technologies (SoC, SIP). Several all-hardware options can be considered for integrating these hardware-based processing resources in the camera or handset (see FIG. 20), including the baseband multimedia processing section, a removable storage device, or the imaging module.

Figure 21:
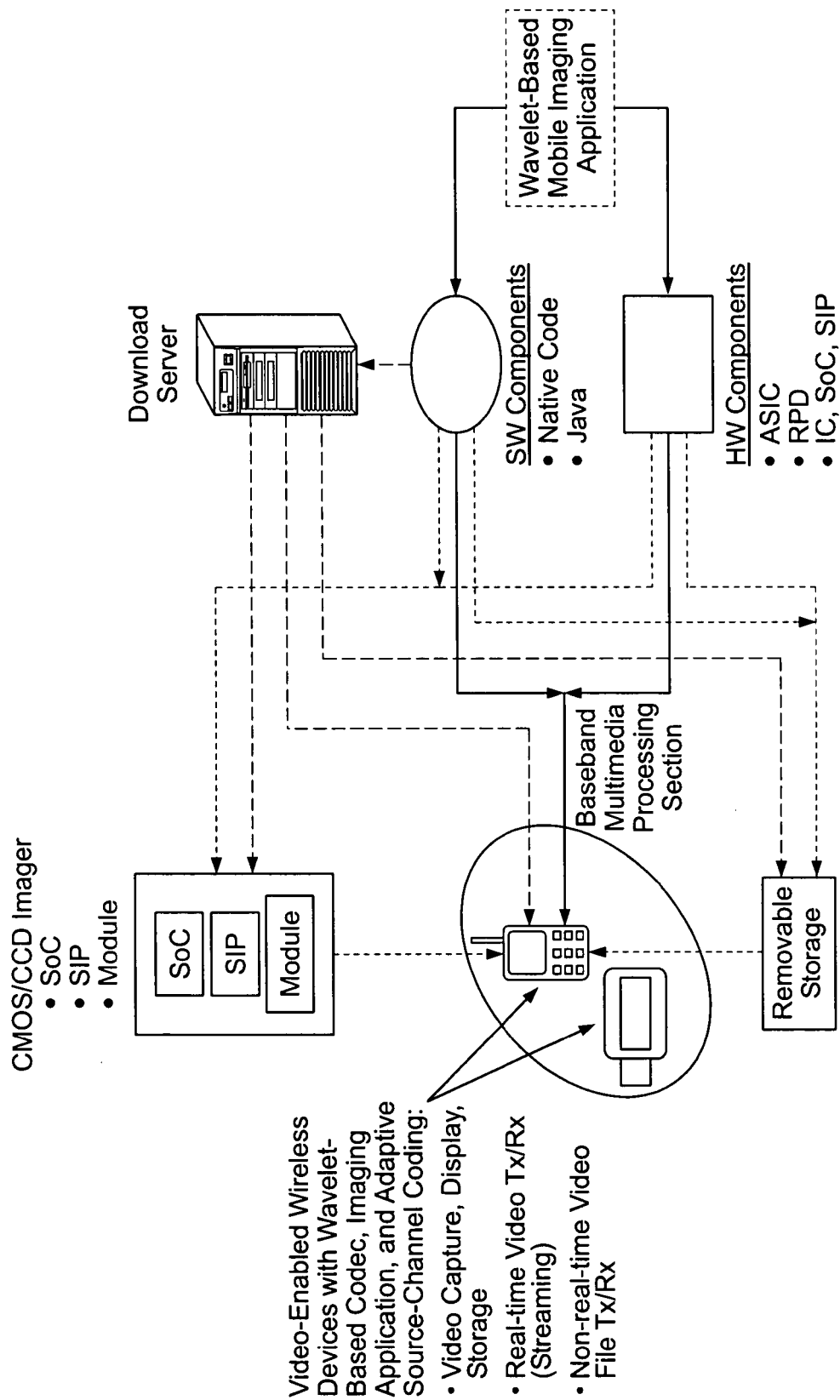
FIG. 21 illustrates implementation options for a hybrid hardware-accelerated and software imaging application in a network camera or wireless handset.

As shown in FIG. 21, hybrid architectures for the imaging application may offer enhancements by implementing some computationally intensive, repetitive, fixed functions in hardware, and implementing in software those functions for which post-manufacturing modification may be desirable or required.

Advantages

The all-software wavelet-based video codec and imaging application, joint source-channel coding, network camera architecture, wireless handset architecture, video monitoring network architectures, wireless video monitoring/messaging service platform architecture, and video messaging/monitoring applications and services described here, individually or in combination deliver higher digital video image quality using lower-cost and lower-complexity network cameras and wireless devices, reduced service deployment complexity, risk and costs via OTA/OTN deployment, and enable operation over a much more heterogeneous range of network architectures and infrastructure equipment.

It should also be noted that when using certain video codecs according to aspects of the present invention, the data representing a particular compressed video can be transmitted over the telecommunications network to the MMSC and that the data can have attached to it a decoder for the compressed video. In this fashion according to aspects of the present invention, it is possible to do away with entirely or to some degree the video Gateway that is otherwise necessary to transcoder video data coming in to the MMSC. This, in part, is facilitated because since each compressed video segment can have its own decoder attached to it, it is not necessary for the MMSC to transcode the video format to a particular video format specified by the receiving wireless device. Instead, the receiving wireless device, for example 1710, can receive the compressed video with attached decoder and simply play the video on the platform of the receiving device 1710. This provides a significant efficiency and cost savings in the structure of the MMSC and its operations.

An additional aspect of the present invention is that the wavelet processing can be designed to accomplish additional video processing functions on the video being processed. For example, the wavelet processing can be designed to accomplish color space conversion, black/white balance, image stabilization, digital zoom, brightness control, and resizing as well as other functions.

Another particular advantage of aspects of the present invention lies in the significantly improved voice synchronization accomplished. With embodiments of the present invention the voice is synchronized to every other frame of video. By comparison, MPEG4 only synchronizes voice to every 15th frame. This results in significant de-synchronization of voice with video, particularly when imperfect transmission of video is accomplished as commonly occurs over mobile networks. Additionally, having voice synchronized to every other frame of video when that video is embodied in the MMSC provides for efficient and expedited editing of the video in the MMSC where such may be done in programs such as automatic or remotely enabled video editing. Additionally, aspects of the present invention are presented in as much as the present encoding techniques allow the embedding of significantly more, or significantly more easily embedded, metadata in the video being generated and compressed. Such metadata can include, among other items, the time, the location where the video was captured (as discerned from the location systems in the mobile handset) and the user making the film. Furthermore, because there is a reference frame in every other frame of video in certain embodiments of the present invention, as compared to a reference frame in every 15 frames of video in MPEG-4 compressed video, embodiments of the present invention provide highly efficient searching of video and editing of video as well as providing much improved audio synchronization.

CONCLUSION

An improved wavelet-based video codec and imaging application, joint source-channel coding, network camera architecture, wireless handset architecture, video monitoring network architectures, wireless video monitoring/messaging service platform architecture, and video messaging/monitoring applications and services are provided by various aspects of the present invention. These improvements combine to substantially reduce the technical complexity and costs related with offering high-quality still and video monitoring applications and services for retail businesses, banks, schools, enterprises, government offices, airports, transportation departments, military installations, and many other organizations.

Improved adaptive joint source-channel coding allows video monitoring network operators, wireless carriers, and MMS service providers to offer a greater range of quality-of-service (QoS) performance and pricing levels to their customers, thus maximizing the revenues generated using their network infrastructure. Improved adaptive joint-source channel coding, based on algorithms with higher computational efficiency, enables support for a much higher level of network homogeneity, in terms of channel types (wireless and wire line), channel bandwidths, channel noise/error characteristics, infrastructure equipment, user devices, and user services.

While the above is a complete description of the preferred embodiments of the invention, various alternatives, modifications, and equivalents may be used. Therefore, the above description should not be taken as limiting the scope of the invention which is defined by the appended claims.

What is claimed is:

1. A method of deploying an imaging service platform comprising the steps of:

providing a transcoder application on a first download server area connected to a network;

signaling the network that the transcoder application is available for deployment; and deploying the transcoder application over the network from the first download server to a video gateway located on the network;

providing a mobile video imaging application on a second download server area connected to a network;

signaling a video-enabled device connected to the network that the mobile video imaging application is available for deployment; and deploying the mobile video imaging application over the network from the second download server to the video-enabled device.

2. The method of claim 1, wherein the first and second download server areas are located on the same server.

3. The method of claim 1, wherein the first and second download server areas are located on different servers.

4. The method of claim 1, wherein the video-enabled device communicates with the network wirelessly.

5. The method of claim 1, wherein the video imaging application includes an encoder.

6. The method of claim 1, wherein the video imaging application includes a decoder.

7. The method of claim 1, wherein the video imaging application includes an encoder and a decoder.

8. The method of claim 1, wherein the video imaging application includes a decoder and compressed video data.

9. The method of claim 1, wherein the transcoder application serves to transcode between a first video format to a second video format.

10. The method of claim 1, wherein the deploying step includes deploying a joint source channel coding component operable to adjust in real time at least one of a source encoder, channel encoder or a rate controller based on changes in the available bandwidth and/or error information received at the video-enabled device.

* * * * *